US010653045B2

(12) United States Patent
Chang et al.

(10) Patent No.: US 10,653,045 B2
(45) Date of Patent: May 12, 2020

(54) DISPLAY APPARATUS

(71) Applicant: LG ELECTRONICS INC., Seoul (KR)

(72) Inventors: Hyeuk Chang, Seoul (KR); Joongnyon Kim, Seoul (KR); Dohyun Koo, Seoul (KR); Sungwook Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/645,342

(22) Filed: Jul. 10, 2017

(65) Prior Publication Data

US 2018/0020579 A1    Jan. 18, 2018

(30) Foreign Application Priority Data

Jul. 12, 2016   (KR) .................. 10-2016-0088037

(51) Int. Cl.
*H05K 7/20* (2006.01)

(52) U.S. Cl.
CPC ......... *H05K 7/20972* (2013.01); *H05K 7/202* (2013.01); *H05K 7/20154* (2013.01); *H05K 7/20209* (2013.01); *H05K 7/20963* (2013.01)

(58) Field of Classification Search
CPC .......... H05K 7/20972; H05K 7/20209; H05K 7/20154; H05K 7/20963; H05K 7/202
USPC ............. 361/678, 679.5, 690, 694, 696, 701
See application file for complete search history.

(56) References Cited

U.S. PATENT DOCUMENTS 5,991,153 A    11/1999 Heady et al.
9,414,516 B2 *  8/2016 Chin .................. H05K 7/20145

| | | | |
|---|---|---|---|
| 2002/0121555 A1* | 9/2002 | Cipolla | H04L 7/0338 236/49.1 |
| 2003/0140638 A1* | 7/2003 | Arshansky | A47F 3/0482 62/155 |
| 2005/0018245 A1* | 1/2005 | Silverbrook | B41J 2/01 358/1.15 |

(Continued)

FOREIGN PATENT DOCUMENTS

| | | |
|---|---|---|
| KR | 1020110080896 | 7/2011 |
| KR | 1020120028075 | 3/2012 |
| WO | 2013182733 | 12/2013 |

OTHER PUBLICATIONS

PCT International Application No. PCT/KR2017/007354, International Search Report dated Nov. 17, 2017, 3 pages.

*Primary Examiner* — Jayprakash N Gandhi
*Assistant Examiner* — Stephen S Sul
(74) *Attorney, Agent, or Firm* — Lee, Hong, Degerman, Kang & Waimey

(57) ABSTRACT

The present invention relates to a display apparatus. According to an embodiment of the present invention, the display apparatus includes a case, a display inside the case, and a heat exchanger disposed on a rear surface of the case to perform heat exchange between an outside and an inside of the case, wherein a first space and a second space separated from each other are formed on a front surface and a rear surface of the display, respectively, and heat exchange is performed between the first space and the second space, wherein heat exchange with the second space and the outside is performed through the heat exchanger. Thereby, the temperature inside the display apparatus that is installable outside may be effectively cooled.

11 Claims, 14 Drawing Sheets

(56) References Cited

U.S. PATENT DOCUMENTS

| | | | |
|---|---|---|---|
| 2009/0310059 A1* | 12/2009 | Kim | G02F 1/133385 |
| | | | 349/58 |
| 2010/0321887 A1* | 12/2010 | Kwon | H05K 7/20972 |
| | | | 361/695 |
| 2011/0019363 A1 | 1/2011 | Vahlsing et al. | |
| 2011/0058326 A1* | 3/2011 | Idems | G09F 9/30 |
| | | | 361/679.21 |
| 2011/0085302 A1* | 4/2011 | Nakamichi | H05K 7/20972 |
| | | | 361/695 |
| 2012/0131936 A1* | 5/2012 | Yoshida | G09F 9/35 |
| | | | 62/176.6 |
| 2012/0215359 A1* | 8/2012 | Michael | G06F 1/206 |
| | | | 700/275 |
| 2012/0236499 A1* | 9/2012 | Murayama | H04N 5/64 |
| | | | 361/696 |
| 2013/0130609 A1* | 5/2013 | Chen | H05K 7/20745 |
| | | | 454/184 |
| 2014/0071384 A1* | 3/2014 | Ho | G02F 1/136204 |
| | | | 349/106 |
| 2015/0156445 A1* | 6/2015 | Lee | H04N 5/63 |
| | | | 348/569 |
| 2016/0270220 A1* | 9/2016 | Omote | H01L 31/048 |

\* cited by examiner

DISPLAY APPARATUS

CROSS-REFERENCE TO RELATED APPLICATION

Pursuant to 35 U.S.C. § 119(a), this application claims the benefit of earlier filing date and right of priority to Korean Patent Application No. 10-2016-0088037, filed on Jul. 12, 2016, the contents of which are all hereby incorporated by reference herein in its entirety.

BACKGROUND OF THE INVENTION

1. Field of the Invention

The present invention relates to a display apparatus, and more particularly, to a display apparatus which is installable outside and enables an interior thereof to be effectively cooled.

2. Description of the Related Art

The display apparatus is an apparatus for outputting an image. The display apparatus may output an image through a display panel or project an image to the outside using visible light or the like.

There is an increasing tendency to place commercial display apparatuses outdoors. Accordingly, for a display apparatus disposed outside, a method of reducing the generated heat while satisfying the waterproof and stain-proof conditions and considering a situation where the display apparatus is directly affected by direct sunlight has been studied.

SUMMARY OF THE INVENTION

Therefore, the present invention has been made in view of the above problems, and it is an object of the present invention to provide a display apparatus which is installable outside and enables an interior thereof to be effectively cooled.

In accordance with an aspect of the present invention, the above and other objects can be accomplished by the provision of a display apparatus including a case, a display inside the case, and a heat exchanger disposed on a rear surface of the case to perform heat exchange between an outside and an inside of the case, wherein a first space and a second space separated from each other are formed on a front surface and a rear surface of the display, respectively, and heat exchange is performed between the first space and the second space, wherein heat exchange with the second space and the outside is performed through the heat exchanger.

In accordance with another aspect of the present invention, there is provided a display apparatus including a case, a display inside the case, and a heat exchanger disposed on a rear surface of the case to perform heat exchange between an outside and an inside of the case, wherein a first space and a second space separated from each other are formed on a front surface and a rear surface of the display, respectively, wherein heat exchange between the first space and the outside and between the first space and the second space is performed through a first air flow formed in the first space and on the outside.

In accordance with another aspect of the present invention, there is provided a display apparatus including a case, a display inside the case, and a heat exchanger disposed on a rear surface of the case to perform heat exchange between an outside and an inside of the case, wherein a first space and a second space separated from each other are formed on a front surface and a rear surface of the display, respectively, wherein heat exchange between the first space, the second space, and the outside is performed through a first air flow formed in the first space, a second air flow formed in the second space, and a third air flow formed on the outside.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

As used herein, the suffixes "module" and "unit" are added simply to facilitate preparation of this specification and are not intended to suggest special meanings or functions. Therefore, the suffixes "module" and "unit" may be used interchangeably.

Figure 1:
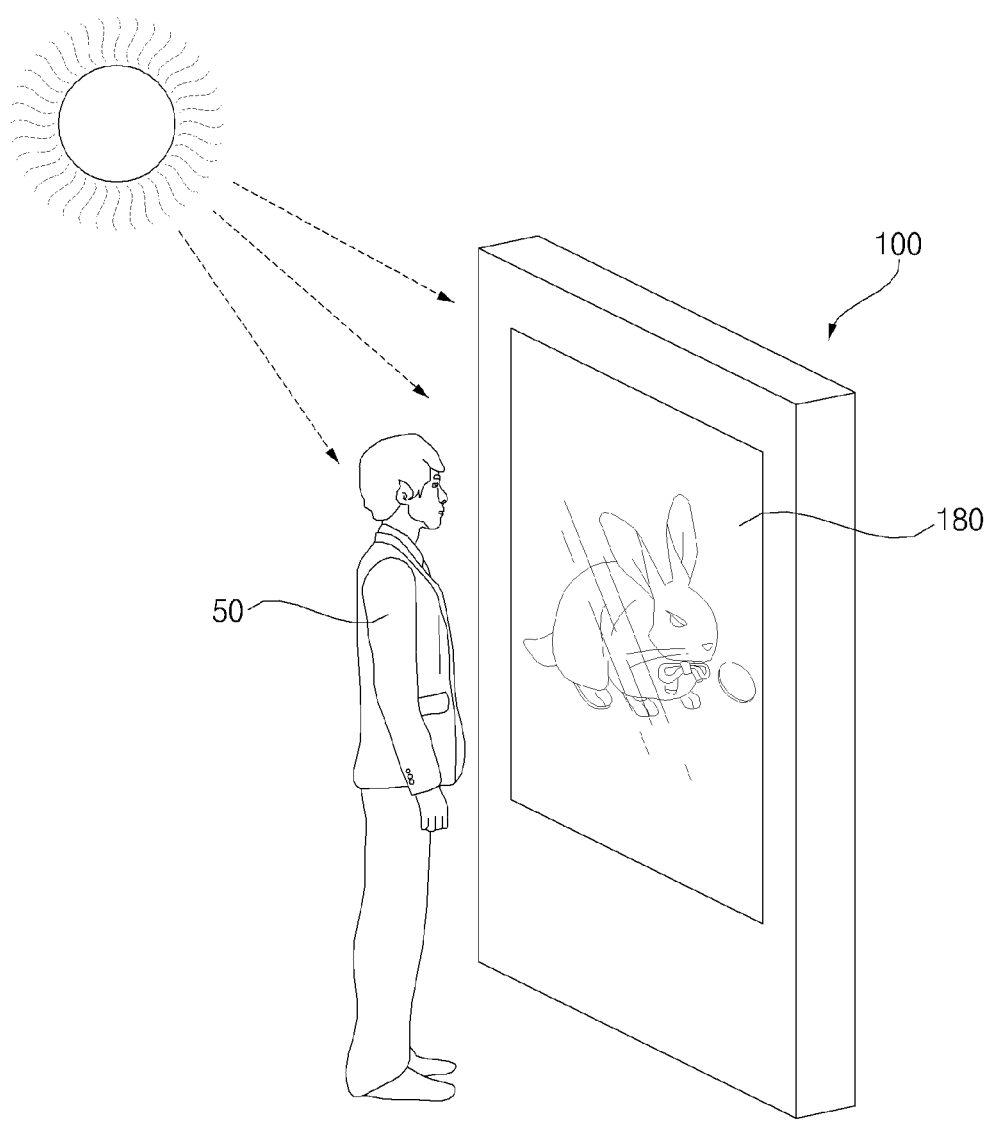
FIG. 1 is a view showing an appearance of a display apparatus according to an embodiment of the present invention.

FIG. 1 is a view showing an appearance of a display apparatus according to an embodiment of the present invention.

Referring to FIG. 1, a display apparatus 100 may be installed at an outdoor public place or the like.

For example, the display apparatus 100 may be installed in a public facility such as a vehicle, a terminal, a train station, and an airport to provide information such as advertisements, news, and notices. The display apparatus 100 may also be arranged around a show window in a store such as a department store, a shopping mall, a superstore or the like to advertise a specific item.

The display apparatus 100 may include a display 180 disposed inside a casing.

The user 50 may view an image displayed on the display apparatus 100, as shown in the figure.

When the display apparatus 100 is placed outdoors as shown in the figure, the temperature inside the display apparatus 100 may rise. In particular, when the display apparatus is directly exposed to sunlight during the daytime, the temperature around the display 180 may be rapidly increased.

The present invention proposes a method of effectively lowering the temperature of the inside of a display apparatus which is installable outside.

According to an embodiment of the present invention, the display apparatus 100 includes a case 101, a display 180 inside the case 101, and a heat exchanger 110*a* disposed on the rear surface of the case 101 to perform heat exchange between the outside Ou and the inside of the case 101.

Here, a first space SP1 and a second space SP2 separated from each other are formed on the front surface of the display 180 and the rear surface of the display 180, respectively. Heat exchange is performed between the first space SP1 and the second space SP2 and between the second space SP2 and the outside Ou through the heat exchanger 110*a*. By such heat exchange, the inside of the display apparatus that is installable outside may be effectively cooled.

Particularly, the first space on the front surface of the display 180 and the second space on the rear surface of the display 180 are separated to reduce the temperature of the first space through heat exchange with the second space and to reduce the temperature of the second space by performing heat exchange with the outside through the heat exchanger 110*a* disposed on the rear surface of the case 101. Thereby, heat exchange and temperature reduction may be performed stage by stage. Accordingly, the inside of the display apparatus 100 that is installable outside may be effectively cooled.

Hereinafter, the internal structure, operation and the like of the display apparatus 100 will be described in more detail with reference to FIG. 3.

Figure 2:
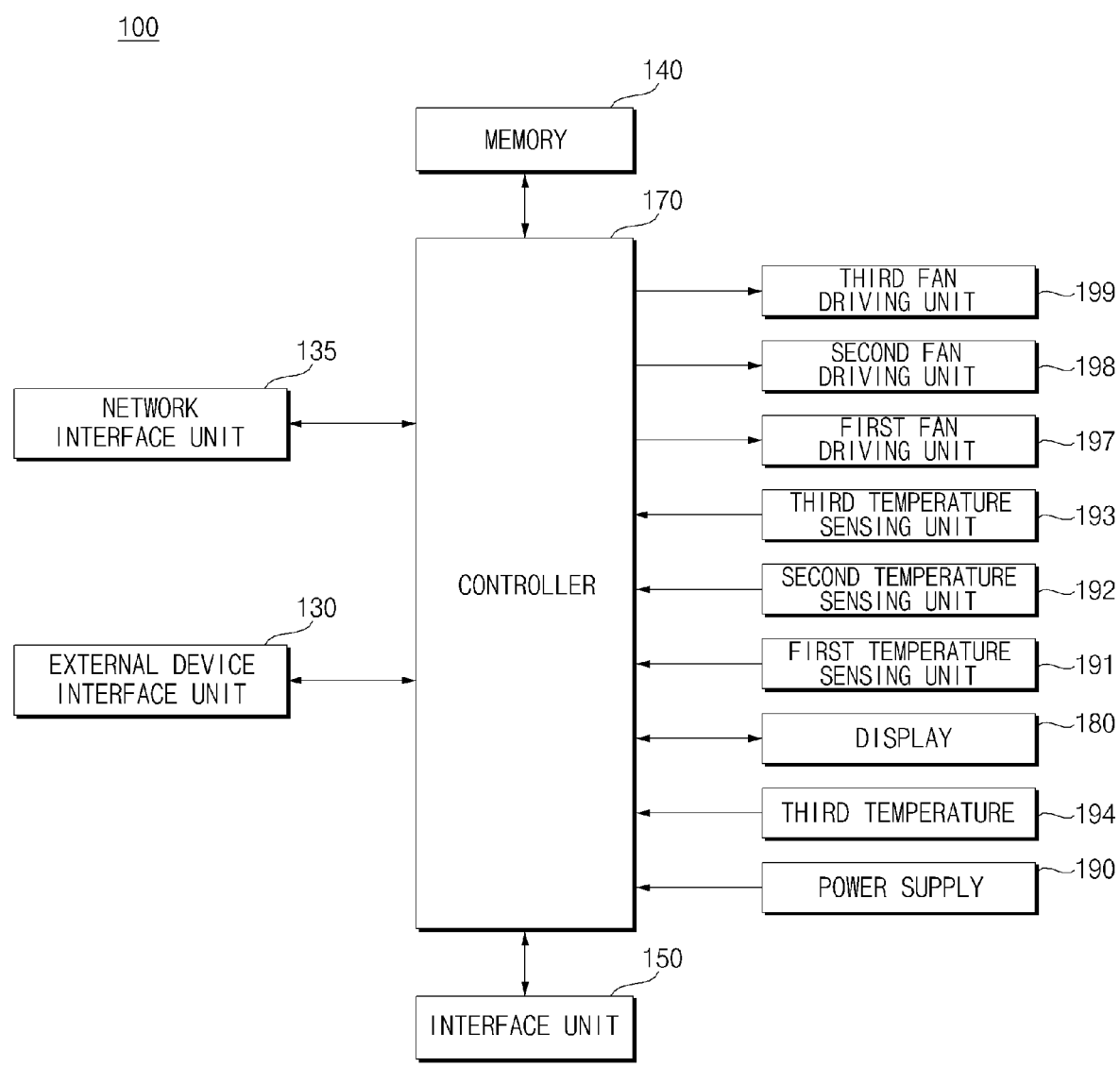
FIG. 2 is an exemplary internal block diagram illustrating the display apparatus of FIG. 1.

FIG. 2 is an exemplary internal block diagram illustrating the display apparatus of FIG. 1.

Referring to FIG. 2, the display apparatus 100 may include an external device interface unit 130, a network interface unit 135, a memory 140, a controller 170, a display 180, a power supply 190, an audio output unit 194, a first temperature sensing unit 191, a second temperature sensing unit 192, a third temperature sensing unit 193, a first fan driving unit 197, a second fan driving unit 198, and a third fan driving unit 199.

The external device interface unit 130 may transmit and receive data to and from an external device (not shown) connected thereto. To this end, the external device interface unit 130 may include an audio/video (A/V) input/output unit (not shown) or a data input/output unit (not shown).

For example, the external device interface unit 130 may include an HDMI terminal, an RGB terminal, a component terminal, a USB terminal, and a micro SD terminal.

The network interface unit 135 provides an interface for connecting the display apparatus 100 to a wired/wireless network including the Internet. For example, the network interface unit 135 may transmit and receive content or data provided by an Internet or content provider or a network operator over a network.

The memory 140 may store a program for processing and control of each signal in the controller 170 and may store signal-processed image, audio, or data signals.

In addition, the memory 140 may perform a function to temporarily store image, audio, or data signals input to the external device interface unit 130.

Meanwhile, the display 180 may include various display panels such as an LCD, an OLED, and a PDP, and may display a predetermined image through the display panel.

The user input interface unit 150 transmits a signal input by the user to the controller 170 or a signal from the controller 170 to the user.

To this end, the user input interface unit 150 may include a local key including a power key, and a touch panel allowing user information to be input therethrough.

The controller 170 may control overall operations of the display apparatus 100. Specifically, the controller 170 may control operation of each unit in the display apparatus 100.

The controller 170 may perform a control operation such that a video image stored in the memory 140 or a video image received from an external device through a communication module 135 is output as an output image.

In particular, the controller 170 may control the display 180 to output a predetermined image. Specifically, the R, G, and B signals corresponding to a video image to be displayed may be output to the display 180. Thereby, the display 180 may display the predetermined image.

The power supply 190 may receive external power or internal power under control of the controller 170 and supply power necessary for operation of the respective components.

The power supply 190 supplies the corresponding power throughout the display apparatus 100. In particular, the power supply may supply power to the controller 170, which may be implemented in the form of a system on chip (SOC), the display 180 for displaying images, and the audio output unit 194 for audio output.

The first temperature sensing unit 191 may sense the temperature of the first space SP1 positioned on the front surface of the display 180, and the second temperature sensing unit 192 may sense the temperature of the second space SP2 positioned on the rear surface of the display 180. The third temperature sensing unit 193 may sense the temperature of the exterior of the display apparatus 100, that is, the temperature in the vicinity of the heat exchanger 110*a*.

The first temperature detected by the first temperature sensing unit 191, the second temperature sensed by the second temperature sensing unit 192, and the third temperature sensed by the third temperature sensing unit 193 may be input to the controller 170. The controller 170 may control the operation of at least one of the first fan driving unit 197, the second fan driving unit 198 and the third fan driving unit 199 based on the first temperature, the second temperature and the third temperature.

For example, when the first temperature is the highest and the third temperature is the lowest among the first to third temperatures, the controller 170 may control the first fan driving unit 197, the second fan driving unit 198, and the third fan driving unit 199 to operate or control the first fan driving unit 197 and the second fan driving unit 198 to operate, such that the cooling operation is effectively performed.

As another example, when the second temperature is the highest and the third temperature is the lowest among the first to third temperatures, the controller 170 may prevent the first fan driving unit 197 from operating and control the second fan driving unit 198 and the third fan driving unit 199 to operate or control only the second fan driving unit 198 to operate.

The first fan driving unit 197, the second fan driving unit 198 and the third fan driving unit 199 may drive at least one fan module 197*a*, 197*b* disposed in the first space, at least one fan module 198*a*, 198*b* disposed in the second space, and at least one fan module 199*a*, 199*b* disposed at the outside.

When the two fan modules 197*a* and 197*b* disposed in the first space operate, the rotation directions of the internal fans or motors are preferably opposite to each other. That is, when the two fan modules 197*a* and 197*b* operate, the flows of air driven by the internal fans are preferably formed in opposite directions such that the air circulates in a certain direction, which may be clockwise or counterclockwise.

Similarly, when the two fan modules 198a and 198b disposed in the second space operate, the rotation directions of the internal fans or motors are preferably opposite to each other. That is, when the two fan modules 198a and 198b operate, the flows of air driven by the internal fans are preferably formed in opposite directions such that the air circulates in a certain direction, which may be clockwise or counterclockwise.

Similarly, when the two fan modules 199a and 199b disposed outside operate, the rotation directions of the internal fans or motors are preferably opposite to each other. That is, when the two fan modules 199a and 199b operate, the flows of air driven by the internal fans are preferably formed in opposite directions such that the air circulates in a certain direction, which may be clockwise or counterclockwise.

Figure 3:
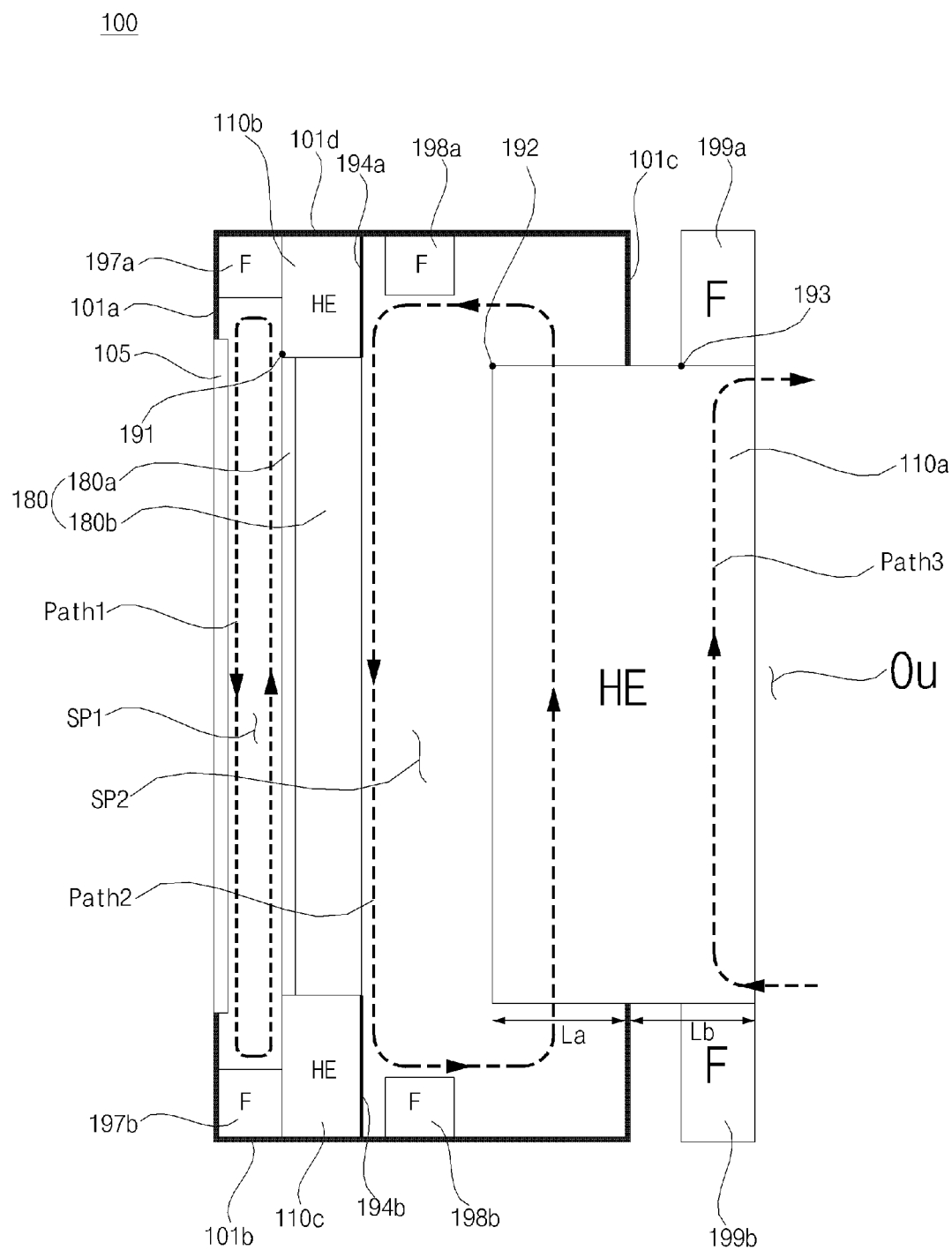
FIG. 3 is a view illustrating an exemplary internal structure of the display apparatus of FIG. 1.

FIG. 3 is a view illustrating an exemplary internal structure of the display apparatus of FIG. 1.

Referring to FIG. 3, the display apparatus 100 may include a case 101, a display 180 inside the case 101, and a heat exchanger 110a disposed on the rear surface of the case 101 to perform heat exchange between the air in the case 101 and the air on the outside Ou.

The display apparatus 100 may further include a first partition 194a disposed at an upper portion of the display 180 and separating the first space SP1 from the second space SP2 and a second partition 194b disposed at a lower portion of the display 180 and separating the first space SP1 from the second space SP2.

The display apparatus 100 may further include at least one of a second heat exchanger 110b disposed at an upper portion of the display 180 for heat exchange between the first space SP1 and the second space SP2 and a third heat exchanger 110c disposed at a lower portion of the display 180 for heat exchange between the first space SP1 and the second space SP2.

The display apparatus 100 may further include at least one fan module 197a, 197b disposed in the first space SP1 and to form a first air flow Path1, and at least one fan module 198a, 198b disposed in the second space SP2 and to form a second air flow Path2.

The display apparatus 100 may further include at least one fan module 199a, 199b disposed at the outside Ou and to form a third air flow Path3.

The display apparatus 100 may additionally include a first temperature sensing unit 191 to sense the temperature of the first space SP1, a second temperature sensing unit 192 to sense the temperature of the second space SP2, and a third temperature sensing unit 193 to sense the temperature of the outside Ou, and a controller 170 to control, based on the temperature information from the first temperature sensing unit 191 to the third temperature sensing unit 193, an air flow to be formed in at least one of the first space SP1, the second space SP2, and the outside Ou.

The case 101 may include a front case 101a, a lower case 101b, a rear case 101c, and an upper case 101d.

The front case 101a, the lower case 101b, the rear case 101c and the upper case 101d may be formed of a metal member, without being limited thereto, to protect the display 180 disposed therein, and may be formed of various materials.

An opening may be formed in a part of the front case 101a, and a front glass 105 may be disposed in an area corresponding to the opening.

Preferably, the size and position of the front glass 105 correspond to the size and position of the display 180.

Preferably, the size of the front glass 105 is larger than the size of the panel 180a of the display 180.

The heat exchanger 110a may be disposed in a part of the area of the rear case 101c. The heat exchanger 110a may perform heat exchange between the inside and outside Ou of the display apparatus 100.

The first space SP1 may be formed on the front surface of the display 180 and the second space SP2 may be formed on the rear surface of the display 180.

The first space SP1 and the second space SP2 may be separated from each other and closed such that the air located in one space is not mixed with the air located in the other space.

The first space SP1 and the second space SP2 may be separated and defined by the first partition 194a disposed at an upper portion of the display 180, a second partition 194b disposed at a lower portion of the display 180, and the display 180 arranged between the first partition 194a and the second partition 194b.

The first space SP1 may be defined by the front case 101a, the front glass 105, a part of the lower case 101b, a part of the upper case 101d, the first partition 194a, the display 180, and the second partition 194b.

The second space SP2 may be defined by the first partition 194a, the display 180, the second partition 194b, a part of the lower case 101b, a part of the upper case 101d, a part of the rear case 101c, and the heat exchanger 110a.

The air flow in the first space SP1 may be referred to as a first air flow Path1, the air flow in the second space SP2 may be referred to as a second air flow Path2, and the air flow on the outside Ou may be referred to as a third air flow Path3.

At least one fan module 197a, 197b for forming the first air flow Path1 may be disposed in the first space SP1.

In the figure, two fan modules 197a and 197b are formed in the upper and lower portions of the first space SP1, respectively. Particularly, the fan module 197a may be attached to a part of the upper case 101d, which is an upper portion of the first space SP1, and the fan module 197b may be attached to a part of the lower case 101b, which is the lower portion of the first space SP1.

At least one fan module 198a, 198b for forming the second air flow Path2 may be disposed in the second space SP2.

In the figure, two fan modules 198a and 198b are formed in the upper and lower portions of the second space SP2, respectively. Particularly, the fan module 198a may be attached to a part of the upper case 101d, which is an upper portion of the second space SP2, and the fan module 198b may be attached to a part of the lower case 101b, which is the lower portion of the second space SP2.

The heat exchanger 110a may be disposed in a part of the rear case 101c, and may protrude toward the second space SP2 and the outside Ou.

While it is illustrated in the figure that the length La of protrusion toward the second space SP2 and the length Lb of protrusion toward the outside Ou are equal to each other, the lengths may be different from each other.

Particularly, in order to lower the temperature of the second space SP2 using the heat exchanger 110a, the heat exchanger 110a may protrude farther to the second space SP2 than to the outside Ou, or may protrude toward the second space SP2 and the outside Ou by the same length, but increase the speed of the second air flow Path2 for the cooling operation.

That is, the protrusion length La toward the second space SP2 and the protrusion length Lb toward the outside Ou may be changed according to the conditions of heat exchange and the respective air flow rates.

Meanwhile, at least one fan module 199a, 199b to form the third air flow Path3 may be further disposed on the outside Ou.

In the figure, two fan modules 199a and 199b are formed on the upper and lower portions of the heat exchanger 110a, respectively.

Each of the two fan modules 197a and 197b disposed in the first space SP1 may include a fan (not shown) and a motor (not shown). In order to form the first air flow Path1, the air flows driven by the respective fan modules are preferably formed in opposite directions to create air circulation.

Meanwhile, each of the two fan modules 198a and 198b disposed in the second space SP2 may include a fan blade (not shown) and a motor (not shown). In order to form the second air flow Path2, the air flows driven by the respective fan modules are preferably formed in opposite directions to create air circulation.

Meanwhile, each of the two fan modules 199a and 199b disposed in the outside Ou may include a fan blade (not shown) and a motor (not shown). In order to form the third air flow Path3, the air flows driven by the respective fan modules are preferably formed in one direction.

The first temperature sensing unit 191 to sense the temperature of the first space SP1 may be disposed in the first space SP1 and the second temperature sensing unit 192 to sense the temperature of the second space SP2 may be disposed in the second space SP2. The third temperature sensing unit 193 to sense the temperature of the outside Ou may be disposed on the outside Ou.

Meanwhile, the display 180 may include a panel 180a and a circuit unit 180b to output an electric signal to the panel 180a.

The external device interface unit 130, the network interface unit 135, the memory 140, the controller 170, the power supply 190, and the like illustrated in FIG. 2 may be disposed in the circuit unit 180b.

The first temperature sensed by the first temperature sensing unit 191, the second temperature sensed by the second temperature sensing unit 192, and the third temperature sensed by the third temperature sensing unit 193 may be input to the controller 170. The controller 170 may control the operation of at least one of the first fan driving unit 197, the second fan driving unit 198 and the third fan driving unit 199 based on the first to third temperatures.

For example, when the first temperature is the highest and the third temperature is the lowest among the first to third temperatures, the controller 170 may control the first fan driving unit 197, the second fan driving unit 198, and the third fan driving unit 199 to operate or control the first fan driving unit 197 and the second fan driving unit 198 to operate, such that cooling is effectively performed.

As another example, when the second temperature is the highest and the third temperature is the lowest among the first to third temperatures, the controller 170 may prevent the first fan driving unit 197 from operating and control the second fan driving unit 198 and the third fan driving unit 199 or only the second fan driving unit 198 to operate.

Referring to FIG. 3, a first space SP1 and a second space SP2, which are separated from each other, are formed on the front surface of the display 180 and the rear surface of the display 180, respectively, and heat exchange is performed between the first space SP1 and the second space SP2.

Thereby, the temperature of the first space SP1 is lowered by heat exchange with the second space SP2.

Meanwhile, heat exchange is performed between the second space SP2 and the outside Ou through the heat exchanger 110a. Thereby, the temperature of the second space SP2 is lowered by heat exchange with the outside Ou.

Specifically, heat exchange is performed between the first space SP1 and the second space SP2 based on the first air flow Path1 of the first space SP1 and the second air flow Path2 of the second space SP2. In addition, heat exchange is performed between the second space SP2 and the outside Ou based on the second air flow Path2 of the second space SP2 and the third air flow Path3 of the outside Ou.

That is, when the first temperature is the highest and the third temperature is the lowest among the first to third temperatures, all of the first fan driving unit 197, the second fan driving unit 198, and the third fan driving unit 199 operate. Thereby, heat exchange is performed between the first space SP1 and the second space SP2 based on the first air flow Path1 of the first space SP1 and the second air flow Path2 of the second space SP2, and heat exchange between the space SP2 and the outside Ou is performed through the second air flow Path2 of the second space SP2 and the third air flow Path3 of the outside Ou, in particular, through the heat exchanger 110a.

As heat exchange is performed through the separated spaces as described above, the air in one space and the air in the other space may perform heat exchange and temperature reduction stage by stage without being mixed with each other. Accordingly, the inside of the display apparatus 100 which is installable outside may be effectively cooled.

To ensure that heat exchange occurs smoothly between the first space SP1 and the second space SP2, the display apparatus 100 may further include at least one of a second heat exchanger 110b disposed at an upper portion of the display 180 for heat exchange between the first space SP1 and the second space SP2 and a third heat exchanger 110c disposed at a lower portion of the display 180 for heat exchange between the first space SP1 and the second space SP2.

Accordingly, heat exchange may be performed between the first space SP1 and the second space SP2 through the second heat exchanger 110b and the third heat exchanger 110c. Thereby, the temperature of the first space SP1 is lowered by heat exchange with the second space SP2.

The second heat exchanger 110b separates the first space SP1 and the second space SP2 at the upper portion of the display 180, while the third heat exchanger 110c separates the first space SP1 and the second space SP2 at the lower portion of the display 180.

The second heat exchanger 110b and the third heat exchanger 110c may replace the partitions 194a and 194b of FIG. 3.

Each of the heat exchanger 110a, the second heat exchanger 110b and the third heat exchanger 110c may include one of commercially available heat exchangers such as a plate heat exchanger, a heat pipe heat exchanger, and a double-sided heat sink heat exchanger.

Figure 4:
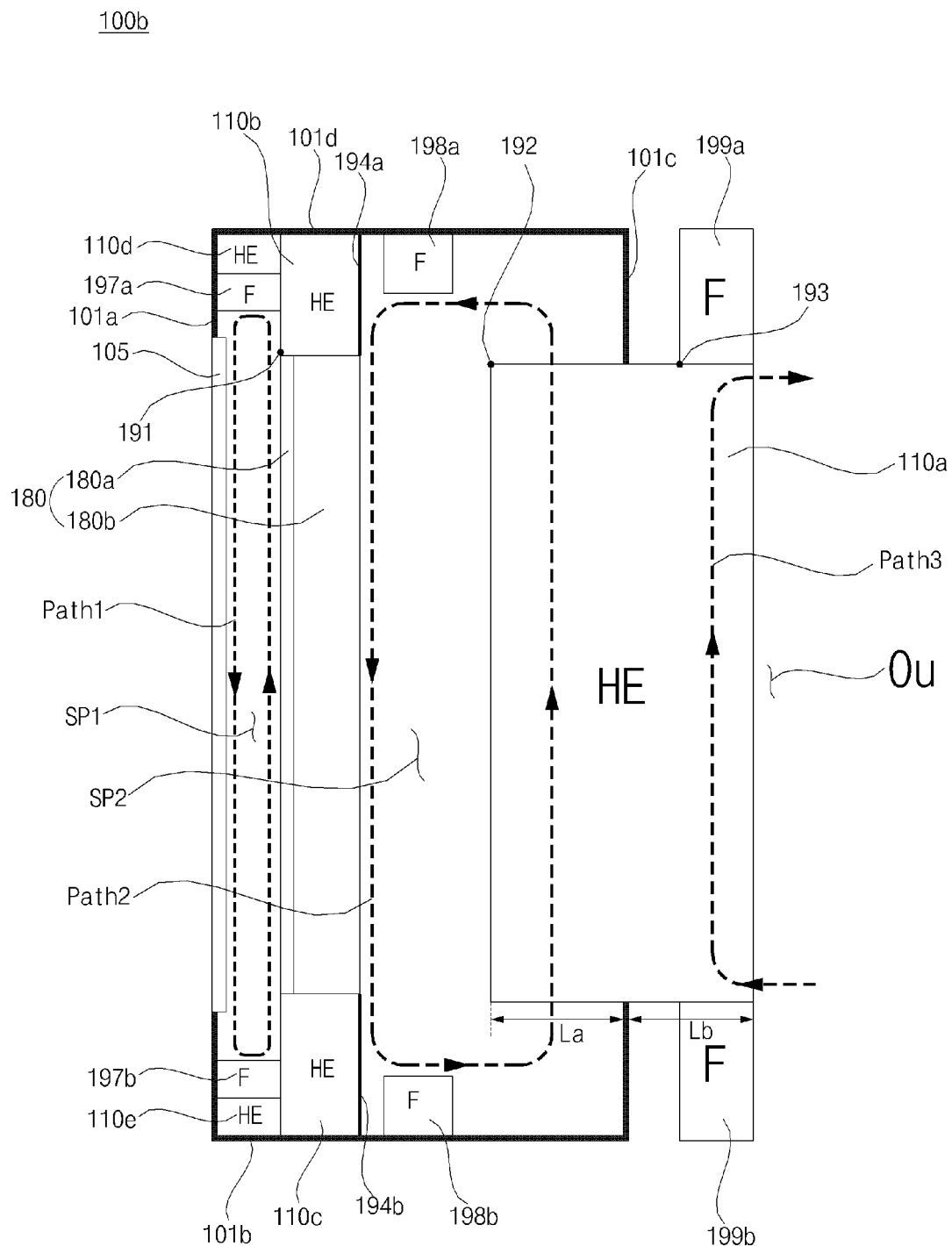
FIGS. 4 to 6 are views illustrating various examples of the internal structure of the display apparatus.
Figure 5:
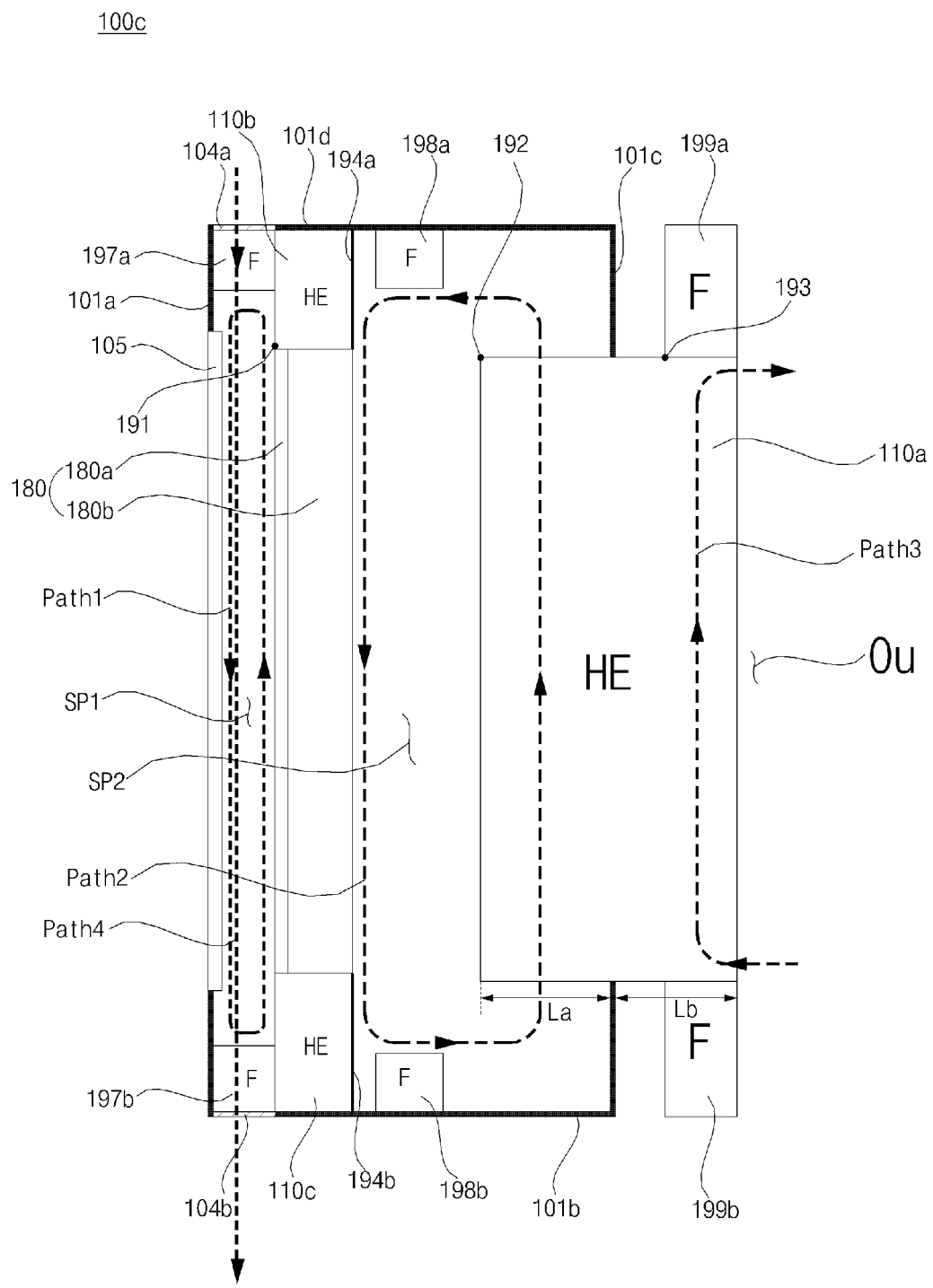
Figure 6:
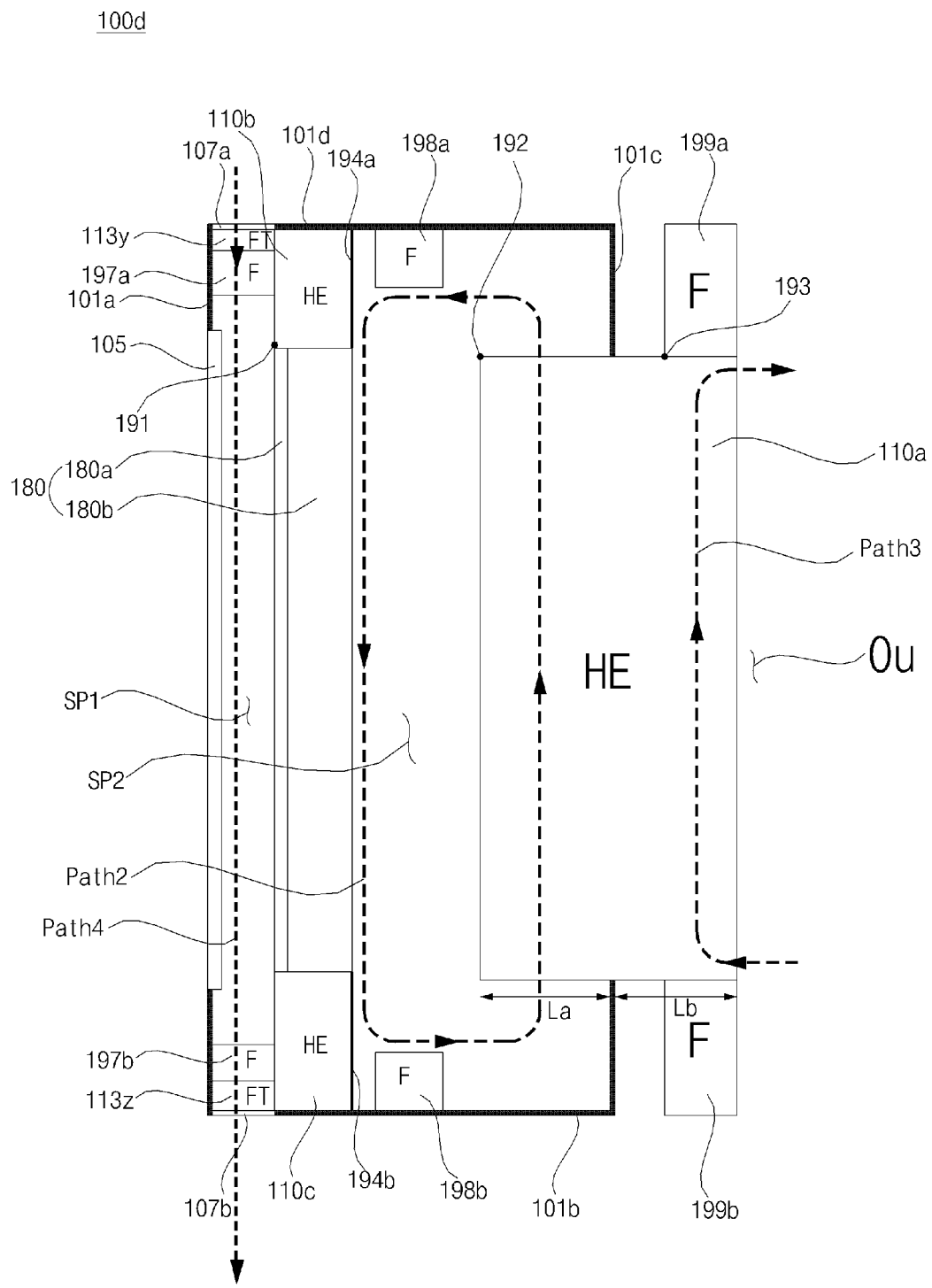

FIGS. 4 to 6 are views illustrating various examples of the internal structure of the display apparatus.

First, FIG. 4 shows another example of the internal structure of the display apparatus.

The display apparatus 100b of FIG. 4 is similar to the display apparatus 100 of FIG. 3. However, in contrast with the display apparatus 100 of FIG. 3, the display apparatus 100b further includes a fourth heat exchanger 110d disposed in an upper portion of the first space SP1 and a fifth heat exchanger 110e disposed in a lower portion of the first space SP1.

In the example of FIG. 4, the fourth heat exchanger 110d is disposed in a part of the upper case 101d, which is an upper portion of the first space SP1, and a fan module 197a is disposed at a lower portion of the fourth heat exchanger 110d.

In addition, in the figure, the fifth heat exchanger 110e is disposed in a part of the lower case 101b, which is a lower portion of the first space SP1, and a fan module 197b is disposed at an upper portion of the fifth heat exchanger 110e.

The fourth heat exchanger 110d and the fifth heat exchanger 110e cause heat exchange to be performed with the outside in the upper portion and the lower portion of the first space SP1. Thereby, heat exchange may be performed more rapidly.

Next, FIG. 5 shows another example of the internal structure of the display apparatus.

The display apparatus 100c of FIG. 5 is similar to the display apparatus 100 of FIG. 3. However, in contrast with the display apparatus 100 of FIG. 3, the display apparatus 100c of FIG. 5 includes a first opening and closing part 104a disposed in an upper portion of the first space SP1 and selectively opened and closed, and a second opening and closing part 104b disposed in a lower portion of the first space SP1 and selectively opened and closed.

The controller 170 may control opening or closing of the first opening and closing part 104a and the second opening and closing part 104b.

As the first opening and closing part 104a and the second opening and closing part 104b are closed, the first air flow Path1 is formed in the first space SP1. As the first opening and closing part 104a and the second opening and closing part 104b are opened, the external air from the outside Ou may flow into the first space SP1, forming a fourth air flow.

For example, when the temperature of the first space SP1 exceeds a reference value, the controller 170 may control the first and second opening and closing parts 104a and 104b to be opened, such that the fourth air flow is formed in the first space SP1.

As another example, when the temperature of the first space SP1 is lower than the reference value, the controller 170 may control the first opening and closing part 104a and the second opening and closing part 104b to be closed, such that the first air flow is formed in the first space SP1. Then, heat exchange may be performed stage by stage through the second air flow and the third air flow as shown in FIG. 3. As described above, as air flows are selectively formed, the temperature of the first space SP1 may be effectively lowered.

Next, FIG. 6 shows another example of the internal structure of the display apparatus.

The display apparatus 100d of FIG. 6 is similar to the display apparatus 100 of FIG. 3. However, in contrast with the display apparatus 100 of FIG. 3, the display apparatus 100d of FIG. 6 further includes a first opening 107a disposed in an upper portion of the first space SP1 and a second opening 107b disposed in a lower portion of the first space SP1.

Thereby, external air from the outside Ou may flow into the first space SP1, forming a fourth air flow Path4. Then, heat exchange may be performed stage by stage through the second air flow Path2 and the third air flow Path3 as shown in FIG. 3.

As air flows are formed as described above, the temperature of the first space SP1 may be stably maintained.

The display apparatus 100d of FIG. 6 may further include filter units 113y and 113z to filter foreign substances to prevent the foreign substances from entering the first space SP1 through the first opening 107a or the like.

Although it is illustrated that the first filter unit 113y is disposed at an upper portion of the first fan module 197a and the second filter module 113z is disposed at a lower portion of the second fan module 197b, different variations may be made to this configuration.

For example, although it is shown that the first filter 113y is disposed under the first fan module 197a and the second filter 113z is disposed above the second fan module 197b, various modifications thereof are possible. The filter units 113y and 113z may be implemented with a nonwoven fabric or various filters such as a mesh-type filter having a small thickness and a fine gap, a filter made of a nonwoven fabric, a HEPA filter with a plicate nonwoven fabric, a filter preventing foreign substances using a cyclone technique, and a filter using the Coandă effect.

Figure 7:
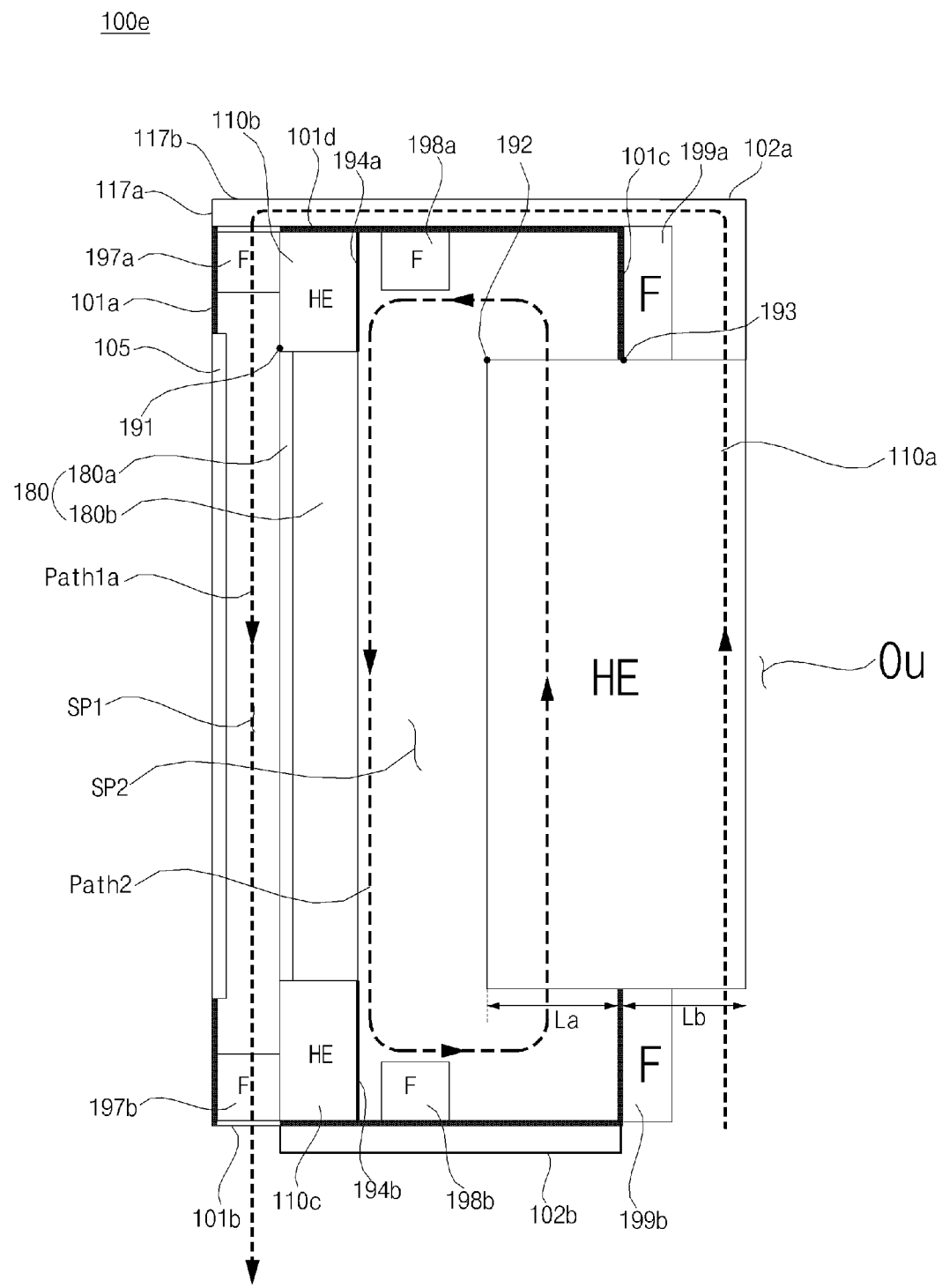
FIG. 7 is a view illustrating another example of the internal structure of the display apparatus of FIG. 1.

FIG. 7 is a view illustrating another example of the internal structure of the display apparatus of FIG. 1.

Referring to FIG. 7, a display apparatus 100e may include a case 101, a display 180 inside the case 101, and a heat exchanger 110a disposed on a rear surface of the case 101 to perform heat exchange between the outside Ou and the inside of the case 101.

The display apparatus 100e i may further include a first partition 194a disposed at an upper portion of the display 180 and separating the first space SP1 from the second space SP2 and a second partition 194b disposed at a lower portion of the display 180 and separating the first space SP1 from the second space SP2.

The display apparatus 100e may further include at least of a second heat exchanger 110b disposed at an upper portion of the display 180 for heat exchange between the first space SP1 and the second space SP2 and a third heat exchanger 110c disposed at a lower portion of the display 180 for heat exchange between the first space SP1 and the second space SP2.

The display apparatus 100e may further include at least one fan module 197a, 197b disposed in the first space SP1 and to form a first air flow Path1a, and at least one fan module 198a, 198b disposed in the second space SP2 and to form a second air flow Path2.

The display apparatus 100e may further include at least one fan module 199a, 199b disposed at the outside Ou and to form the first air flow Path1a.

The display apparatus 100e may further include a guide portion disposed in at least one of the upper portion and the lower part of the first space SP1 to guide the first air flow Path1a from the outside Ou to the first space SP1.

The display apparatus 100e may additionally include a first temperature sensing unit 191 to sense the temperature of the first space SP1, a second temperature sensing unit 192 to sense the temperature of the second space SP2, and a third temperature sensing unit 193 to sense the temperature of the outside Ou, and a controller 170 to control, based on the temperature information from the first temperature sensing unit 191 to the third temperature sensing unit 193, an air flow to be formed in at least one of the first space SP1 and the second space SP2.

The case 101 may include a front case 101a, a lower case 101b, a rear case 101c, and an upper case 101d.

The front case 101a, the lower case 101b, the rear case 101c and the upper case 101d may be formed of a metal member, without being limited thereto, to protect the display 180 disposed therein, and may be formed of various materials.

An opening may be formed in a part of the front case 101*a*, and a front glass 105 may be disposed in an area corresponding to the opening.

Preferably, the size and position of the front glass 105 correspond to the size and position of the display 180.

Preferably, the size of the front glass 105 is larger than the size of the panel 180*a* of the display 180.

The heat exchanger 110*a* may be disposed in a part of the area of the rear case 101*c*. The heat exchanger 110*a* may perform heat exchange between the inside and outside Ou of the display apparatus 100.

The first space SP1 may be formed on the front surface of the display 180 and the second space SP2 may be formed on the rear surface of the display 180.

The first space SP1 and the second space SP2 may be separated from each other.

The second space SP2 may be a closed space, but the first space SP1 may be an open space.

To this end, the display apparatus 100*e* may further include a first opening 114*a* formed in a part of the upper case 101 in the upper portion of the first space SP1 and a second opening 114*a* formed in a part of the lower case 101 in the lower portion of the first space SP1.

The first space SP1 and the second space SP2 may be separated and defined by the first partition 194*a* disposed at an upper portion of the display 180, a second partition 194*b* disposed at a lower portion of the display 180, and the display 180 arranged between the first partition 194*a* and the second partition 194*b*.

The first space SP1 may be defined by the front case 101*a*, the front glass 105, a part of the lower case 101*b*, a part of the upper case 101*d*, the first partition 194*a*, the display 180, and the second partition 194*b*.

The second space SP2 may be defined by the first partition 194*a*, the display 180, the second partition 194*b*, a part of the lower case 101*b*, a part of the upper case 101*d*, and the heat exchanger 110*a*.

The air flow in the first space SP1 may be referred to as a first air flow Path1*a*, and the air flow in the second space SP2 may be referred to as a second air flow Path2.

The air flow of the outside Ou may be directed toward the first space SP1, and this air flow may be called the first air flow Path1*a*, as described above.

To form the first air flow Path1*a* described above, the display apparatus 100*e* may further include a guide portion disposed in at least one of the upper portion and the lower part of the first space SP1 to guide the first air flow Path1*a* from the outside Ou to the first space SP1.

In the figure, a first guide portion 117*a*, which is disposed in an upper portion of the first space SP1 and extends into the upper area of the front case 101*a*, and a second guide portion 117*b*, which intersects the first guide portion 117*a* and extends in parallel with the first guide portion 117*b*, are exemplarily shown.

The display apparatus 100*e* may further include a second case 102*a* connected between the guide portion 114, particularly, the second guide portion 117*b* and a part of the heat exchanger 110*a*.

While the first guide portion 117*a*, the second guide portion 117*b* and the second case 102*a* are shown in the figure as being distinguished from each other, the second guide portion 117*b* may extend to replace the second case 102*a* or the second case 102*a* may extend to replace the first guide portion 117*a* and the second guide portion 117*b*.

The display apparatus 100*e* may further include a third case 102*c* connected to the lower case 101*b* and protruding downward.

Due to the second case 102*a* and the third case 102*c*, the first air flow Path1*a* may be formed in a cap shape.

In order to smoothly form the first air flow, the second guide portion 117*b* preferably extends and protrudes so as to be longer than the upper case 101*d*.

At least one fan module 197*a*, 197*b* for forming the first air flow Path1*a* may be disposed in the first space SP1.

In the figure, two fan modules 197*a* and 197*b* are formed in the upper and lower portions of the first space SP1, respectively. Particularly, the fan module 197*a* may be attached to a part of the upper case 101*d*, which is an upper portion of the first space SP1, and the fan module 197*b* may be attached to a part of the lower case 101*b*, which is the lower portion of the first space SP1.

At least one fan module 198*a*, 198*b* for forming the second air flow Path2 may be disposed in the second space SP2.

In the figure, two fan modules 198*a* and 198*b* are formed in the upper and lower portions of the second space SP2, respectively. Particularly, the fan module 198*a* may be attached to a part of the upper case 101*d*, which is an upper portion of the second space SP2, and the fan module 198*b* may be attached to a part of the lower case 101*b*, which is the lower portion of the second space SP2.

The heat exchanger 110*a* may be disposed in a part of the rear case 101*c*, and may protrude toward the second space SP2 and the outside Ou.

While it is illustrated in the figure that the length La of protrusion toward the second space SP2 and the length Lb of protrusion toward the outside Ou are equal to each other, the lengths may be different from each other.

Particularly, in order to lower the temperature of the second space SP2 using the heat exchanger 110*a*, the heat exchanger 110*a* preferably protrudes farther to the second space SP2 than to the outside Ou.

That is, that the protrusion length La toward the second space SP2 is preferably greater than the protrusion length Lb toward the outside Ou.

Meanwhile, at least one fan module 199*a*, 199*b* to form the first air flow Path1*a* may be further disposed on the outside Ou.

In the figure, two fan modules 199*a* and 199*b* are formed on the upper and lower portions of the heat exchanger 110*a*, respectively.

Each of the two fan modules 197*a* and 197*b* disposed in the first space SP1 may include a fan (not shown) and a motor (not shown). In order to form the first air flow Path1*a*, the fans (not shown) preferably rotate in opposite directions.

Meanwhile, each of the two fan modules 198*a* and 198*b* disposed in the second space SP2 may include a fan (not shown) and a motor (not shown). In order to form the second air flow Path2, the fans (not shown) preferably rotate in opposite directions.

Meanwhile, each of the two fan modules 199*a* and 199*b* disposed in the outside Ou may include a fan (not shown) and a motor (not shown). In order to form the first air flow Path1*a*, the fans (not shown) preferably rotate in opposite directions.

The first temperature sensing unit 191 to sense the temperature of the first space SP1 may be disposed in the first space SP1 and the second temperature sensing unit 192 to sense the temperature of the second space SP2 may be disposed in the second space SP2. The third temperature sensing unit 193 to sense the temperature of the outside Ou may be disposed on the outside Ou.

Meanwhile, the display 180 may include a panel 180a and a circuit unit 180b to output an electric signal to the panel 180a.

The external device interface unit 130, the network interface unit 135, the memory 140, the controller 170, the power supply 190, and the like illustrated in FIG. 2 may be disposed in the circuit unit 180b.

The first temperature sensed by the first temperature sensing unit 191, the second temperature sensed by the second temperature sensing unit 192, and the third temperature sensed by the third temperature sensing unit 193 may be input to the controller 170. The controller 170 may control the operation of at least one of the first fan driving unit 197, the second fan driving unit 198 and the third fan driving unit 199 based on the first to third temperatures.

For example, when the first temperature is the highest and the third temperature is the lowest among the first to third temperatures, the controller 170 may control the first fan driving unit 197, the second fan driving unit 198, and the third fan driving unit 199 to operate or control the first fan driving unit 197 and the second fan driving unit 198 to operate, such that cooling is effectively performed.

As another example, when the second temperature is the highest and the third temperature is the lowest among the first to third temperatures, the controller 170 may prevent the first fan driving unit 197 from operating and control the second fan driving unit 198 and the third fan driving unit 199 or only the second fan driving unit 198 to operate.

Referring to FIG. 7, a first space SP1 and a second space SP2, which are separated from each other, are formed on the front surface of the display 180 and the rear surface of the display 180, respectively, and heat exchange is performed between the first space SP1 and the second space SP2. Thereby, the temperature of the first space SP1 is lowered by heat exchange with the second space SP2.

Meanwhile, heat exchange is performed between the second space SP2 and the outside Ou through the heat exchanger 110a. Thereby, the temperature of the second space SP2 is lowered by heat exchange with the outside Ou.

Specifically, heat exchange is performed between the first space SP1 and the second space SP2 based on the first air flow Path1a of the first space SP1 and the second air flow Path2 of the second space SP2. In addition, heat exchange is performed between the second space SP2 and the outside Ou based on the second air flow Path2 of the second space SP2 and the first air flow Path1a of the outside Ou.

That is, since heat exchange with the second space SP2 is performed through the first air flow Path1a formed on the front and rear surfaces of the display apparatus 100e, the temperature of the display apparatus 100e may be effectively reduced.

For example, when the first temperature is the highest and the third temperature is the lowest among the first to third temperatures, all of the first fan driving unit 197, the second fan driving unit 198, and the third fan driving unit 199 operate. Thereby, heat exchange is performed between the first space SP1 and the second space SP2 based on the first air flow Path1a of the first space SP1 and the second air flow Path2 of the second space SP2, and heat exchange between the space SP2 and the outside Ou is performed through the second air flow Path2 of the second space SP2 and the first air flow Path1a of the outside Ou, in particular, through the heat exchanger 110a.

Since heat exchange is performed through the separated spaces, heat exchange and temperature reduction may be performed stage by stage. Accordingly, the inside of the display apparatus 100e which is installable outside may be effectively cooled.

To ensure that heat exchange occurs smoothly between the first space SP1 and the second space SP2, the display apparatus 100e may further include at least one of a second heat exchanger 110b disposed at an upper portion of the display 180 for heat exchange between the first space SP1 and the second space SP2 and a third heat exchanger 110c disposed at a lower portion of the display 180 for heat exchange between the first space SP1 and the second space SP2.

Accordingly, heat exchange may be performed between the first space SP1 and the second space SP2 through the second heat exchanger 110b and the third heat exchanger 110c. Thereby, the temperature of the first space SP1 is lowered by heat exchange with the second space SP2.

The second heat exchanger 110b separates the first space SP1 and the second space SP2 at the upper portion of the display 180, while the third heat exchanger 110c separates the first space SP1 and the second space SP2 at the lower portion of the display 180.

The second heat exchanger 110b and the third heat exchanger 110c may replace the partitions 194a and 194b of FIG. 7.

Each of the heat exchanger 110a, the second heat exchanger 110b and the third heat exchanger 110c may include one of a plate heat exchanger 110a, a heat pipe heat exchanger 110a, and a double-sided heat sink heat exchanger 110a.

FIGS. 8 to 14 are views illustrating various examples of the internal structure of the display apparatus.

Figure 8:
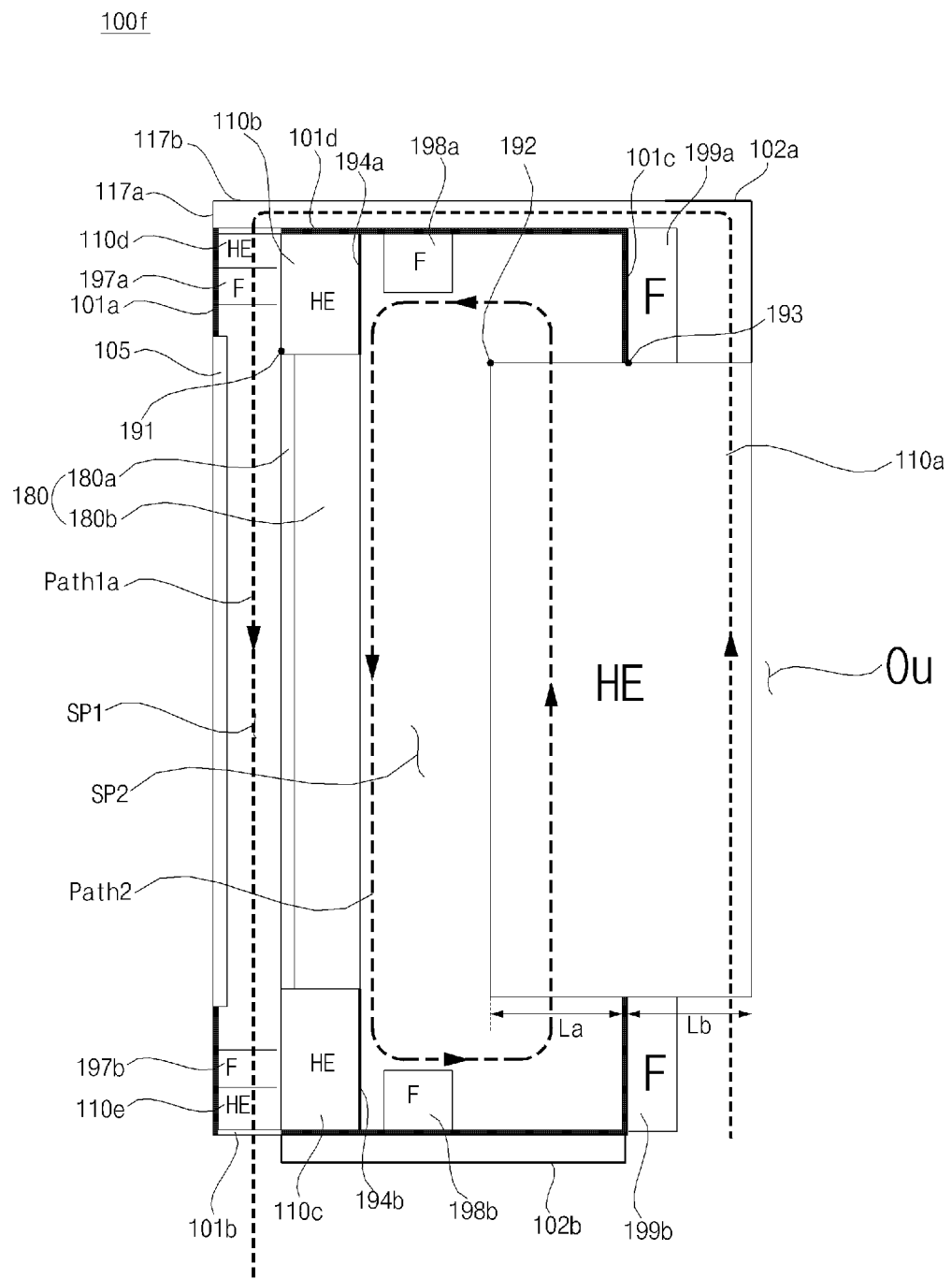
FIGS. 8 to 14 are views illustrating various examples of the internal structure of the display apparatus.

First, FIG. 8 shows another example of the internal structure of the display apparatus.

The display apparatus 100f of FIG. 8 is similar to the display apparatus 100e of FIG. 7. However, in contrast with the display apparatus 100e of FIG. 7, the display apparatus 100f further includes a fourth heat exchanger 110a disposed in an upper portion of the first space SP1 and a fifth heat exchanger 110a disposed in a lower portion of the first space SP1.

In the example of FIG. 4, the fourth heat exchanger 110d is disposed in a part of the upper case 101d, which is an upper portion of the first space SP1, and a fan module 197a is disposed at a lower portion of the fourth heat exchanger 110d.

In addition, in the figure, the fifth heat exchanger 110e is disposed in a part of the lower case 101b, which is a lower portion of the first space SP1, and a fan module 197b is disposed at an upper portion of the fifth heat exchanger 110e.

The fourth heat exchanger 110d and the fifth heat exchanger 110e cause heat exchange to be performed with the outside in the upper portion and the lower portion of the first space SP1. Thereby, heat exchange may be performed more rapidly.

Figure 9:
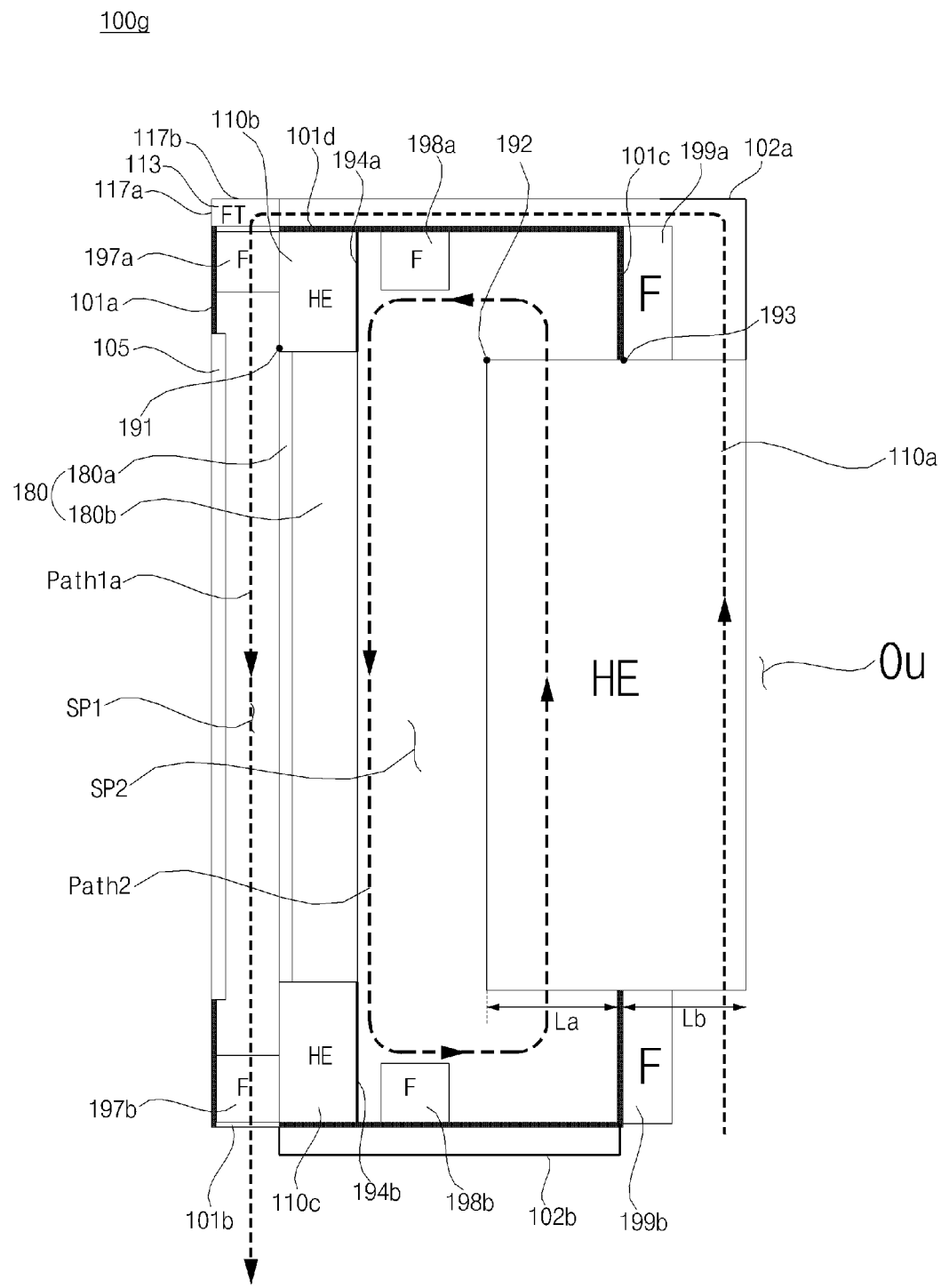

Next, FIG. 9 shows another example of the internal structure of the display apparatus.

The display apparatus 100g of FIG. 9 is similar to the display apparatus 100e of FIG. 7. However, in contrast with the display apparatus 100e of FIG. 7, the display apparatus 100g further includes a filter unit 113 disposed in at least one of the upper portion and the lower portion of the first space SP1.

In FIG. 9, the filter section 113 is illustrated as being disposed in a part of the upper case 101d in the upper portion of the first space SP1. Thereby, filtering of the external air introduced by the first air flow path Path1a becomes possible, and thus foreign substances may be removed.

The filter unit 113 may be implemented with a nonwoven fabric or various filters such as a mesh-type filter having a small thickness and a fine gap, a filter made of a nonwoven fabric, a HEPA filter with a plicate nonwoven fabric, a filter preventing foreign substances using a cyclone technique, and a filter using the Coandă effect.

Figure 10:
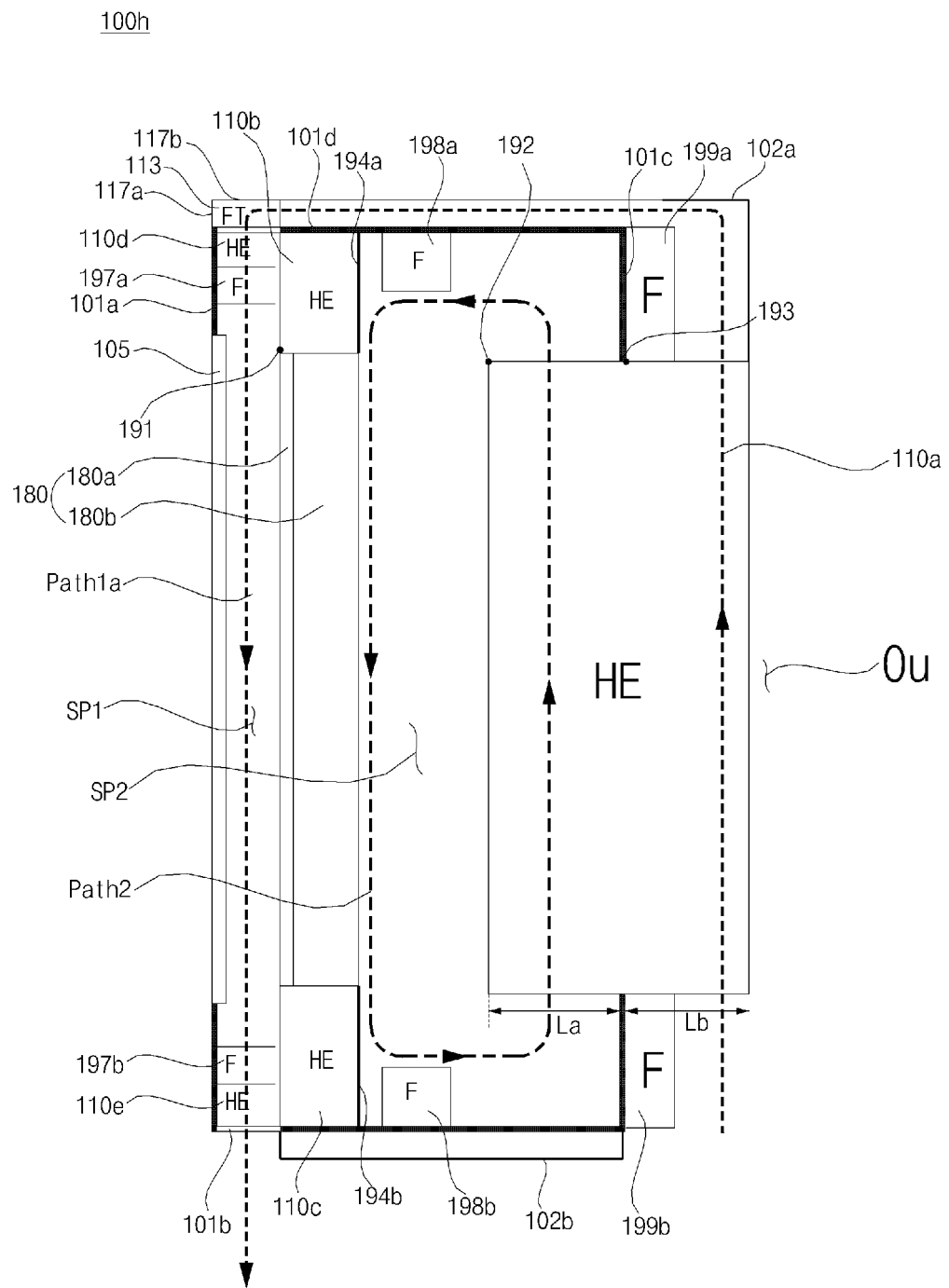

Next, FIG. 10 shows another example of the internal structure of the display apparatus.

The display apparatus 100h of FIG. 10 is similar to the display apparatus 100f of FIG. 8. However, in contrast with the display apparatus 100f of FIG. 8, the display apparatus 100h further includes a filter unit 113 disposed in at least one of the upper portion and the lower portion of the first space SP1.

In FIG. 10, the filter section 113 is illustrated as being disposed in a part of the upper case 101d in the upper portion of the first space SP1. Thereby, filtering of the external air introduced by the first air flow path Path1a becomes possible, and thus foreign substances may be removed.

The filter unit 113 may be implemented with a nonwoven fabric or various filters such as a mesh-type filter having a small thickness and a fine gap, a filter made of a nonwoven fabric, a HEPA filter with a plicate nonwoven fabric, a filter preventing foreign substances using a cyclone technique, and a filter using the Coandă effect.

Figure 11:
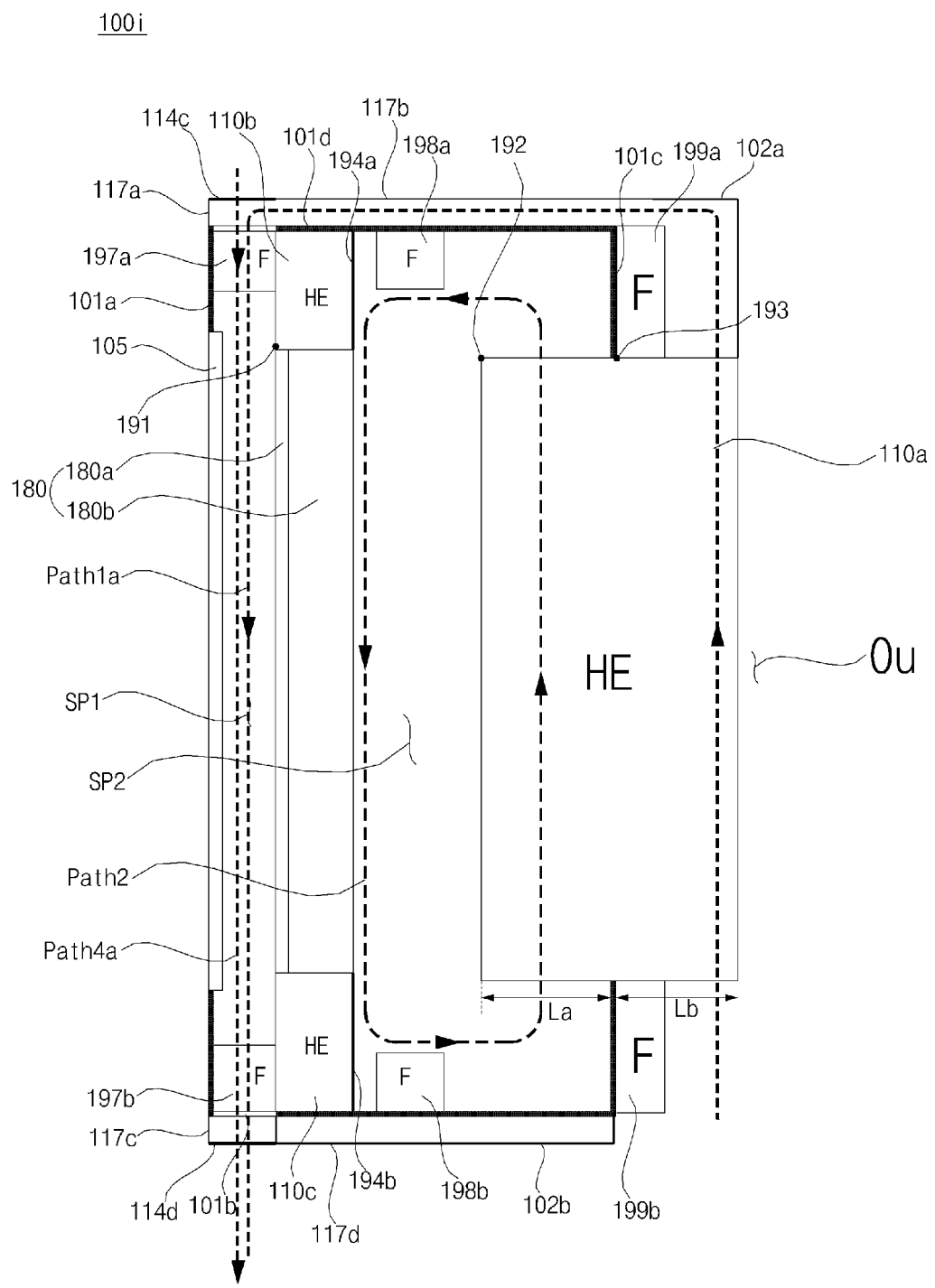

Next, FIG. 11 shows another example of the internal structure of the display apparatus.

The display apparatus 100i of FIG. 11 is similar to the display apparatus 100e of FIG. 7. However, in contrast with the display apparatus 100e of FIG. 7, the display apparatus 100i further includes a third opening 114c formed in a portion of an upper guide portion 114 formed in an upper portion of the first space SP1, and a fourth opening 114d formed in a part of a lower guide portion 114 formed in a lower portion of the first space SP1.

By the third opening 114c and the fourth opening 114d, a fourth air flow Path4a shown in FIG. 11 may be formed as shown in FIG. 11.

That is, in the first space on the front face of the display 180, the fourth air flow Path4a may be directed from the third opening 114c and the first opening 114a toward the second opening 114b and the fourth opening 114d.

Accordingly, since the first air flow Path1a and the fourth air flow Path 4a are simultaneously formed on the front surface of the display 180, the temperature inside the display apparatus 100e may be effectively reduced.

Figure 12:
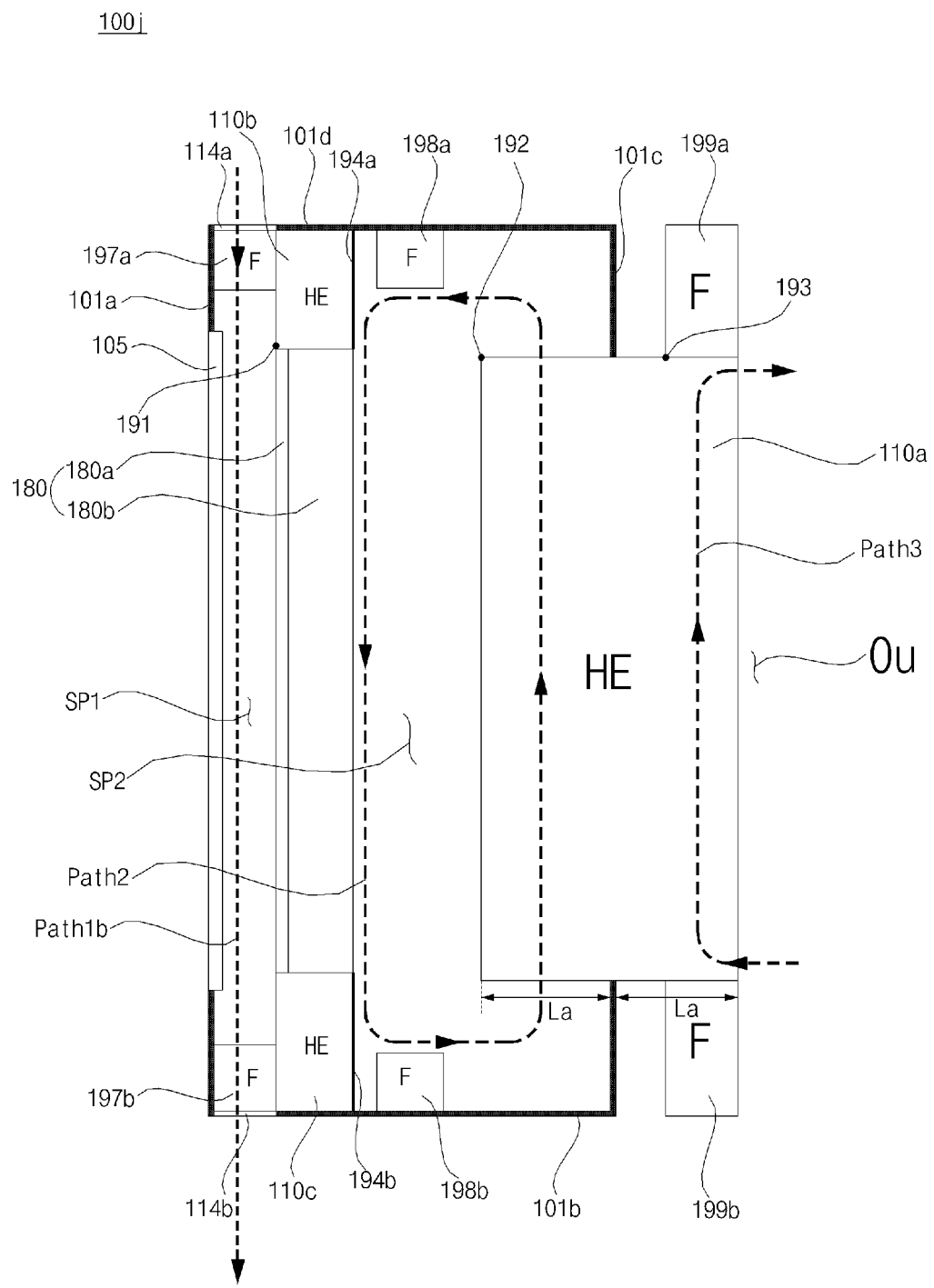

Next, FIG. 12 shows another example of the internal structure of the display apparatus.

The display apparatus 100j of FIG. 12 differs from the display apparatus 100e of FIG. 7 in that the first air flow Path1b is formed in the first space SP1, the second air flow Path2 is formed in the second space SP2, and the third air flow Path3 is formed around the heat exchanger 110a on the rear surface of the display apparatus.

To this end, the display apparatus 100j of FIG. 12 may include a case 101, a display 180 inside the case 101, and a heat exchanger 110a disposed on a rear surface of the case 101 to perform heat exchange between the outside Ou and the inside of the case 101.

The display apparatus 100j of FIG. 12 may further include a first opening 114a formed in a part of the upper case 101 in the upper portion of the first space SP1 and a second opening 114a formed in a part of the lower case 101 in the lower portion of the first space SP1.

Thereby, heat exchange may be performed between the first space SP1, the second space SP2, and the outside Ou through the first air flow Path1b formed in the first space SP1, the second air flow Path2 formed in the second space SP2, and the third air flow Path1 formed at the outside Ou.

As a result, external air from the outside Ou may flow into the first space SP1, forming the first air flow Path1b. In addition, heat exchange may be performed stage by stage through the second air flow Path2 formed in the second space SP2 and the third air flow Path3 formed around the heat exchanger 110a at the outside.

As air flows are formed as described above, the temperature of the first space SP1 may be stably maintained.

Figure 13:
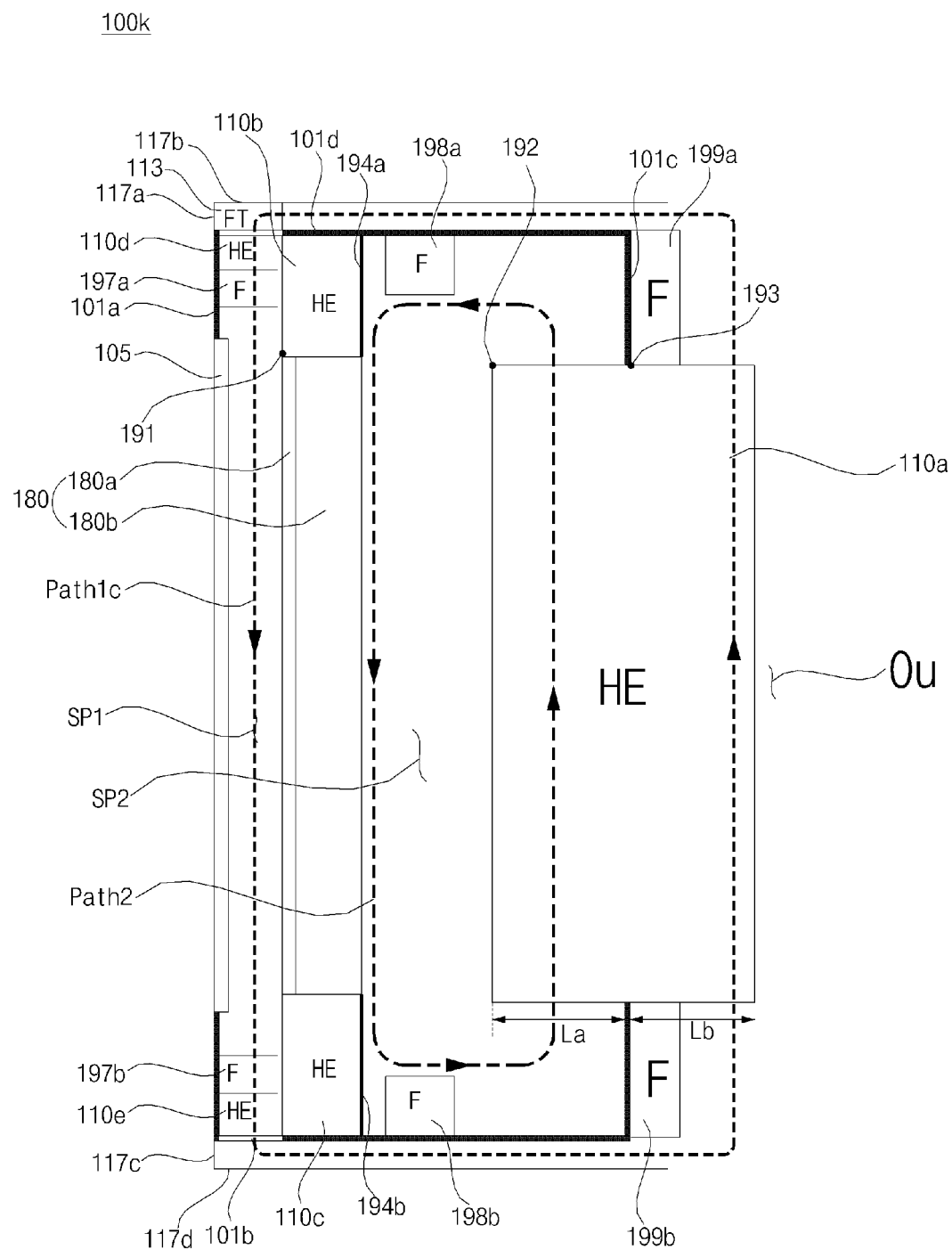

Next, FIG. 13 shows another example of the internal structure of the display apparatus.

The display apparatus 100k of FIG. 13 differs from the display apparatus 100h of FIG. 10 in that the first air flow Path1b is a circulating flow in a rectangular shape rather than a flow in a cap shape.

To this end, the display apparatus 100k of FIG. 13 may further include a guide portion 114 disposed in at least one of the upper portion and the lower part of the first space SP1 to guide the first air flow Path1b from the outside Ou toward the first space SP1.

In FIG. 13, a first guide portion 117a, which is disposed in an upper portion of the first space SP1 and extends from the upper area of the front case 101a, a second guide portion 117b, which intersects the first guide portion 117a and extends in parallel with the first guide portion 117b, a third guide portion 117c, which is disposed in a lower portion of the first space SP1 and extends into the lower area of the front case 101a, and a fourth guide portion 117d, which intersects the third guide portion 117c and extends in parallel with the lower case 101b, are exemplarily shown.

In order to smoothly form the first air flow, the second guide portion 117b preferably extends and protrudes so as to be longer than the upper case 101d.

The fourth guide portion 117d preferably extends and protrudes so as to be longer than the lower case 101b.

Although the second case 102a and the third case 102b are not shown in FIG. 13 in contrast with FIG. 10, the display apparatus 100k may further include the second case 102a.

Figure 14:
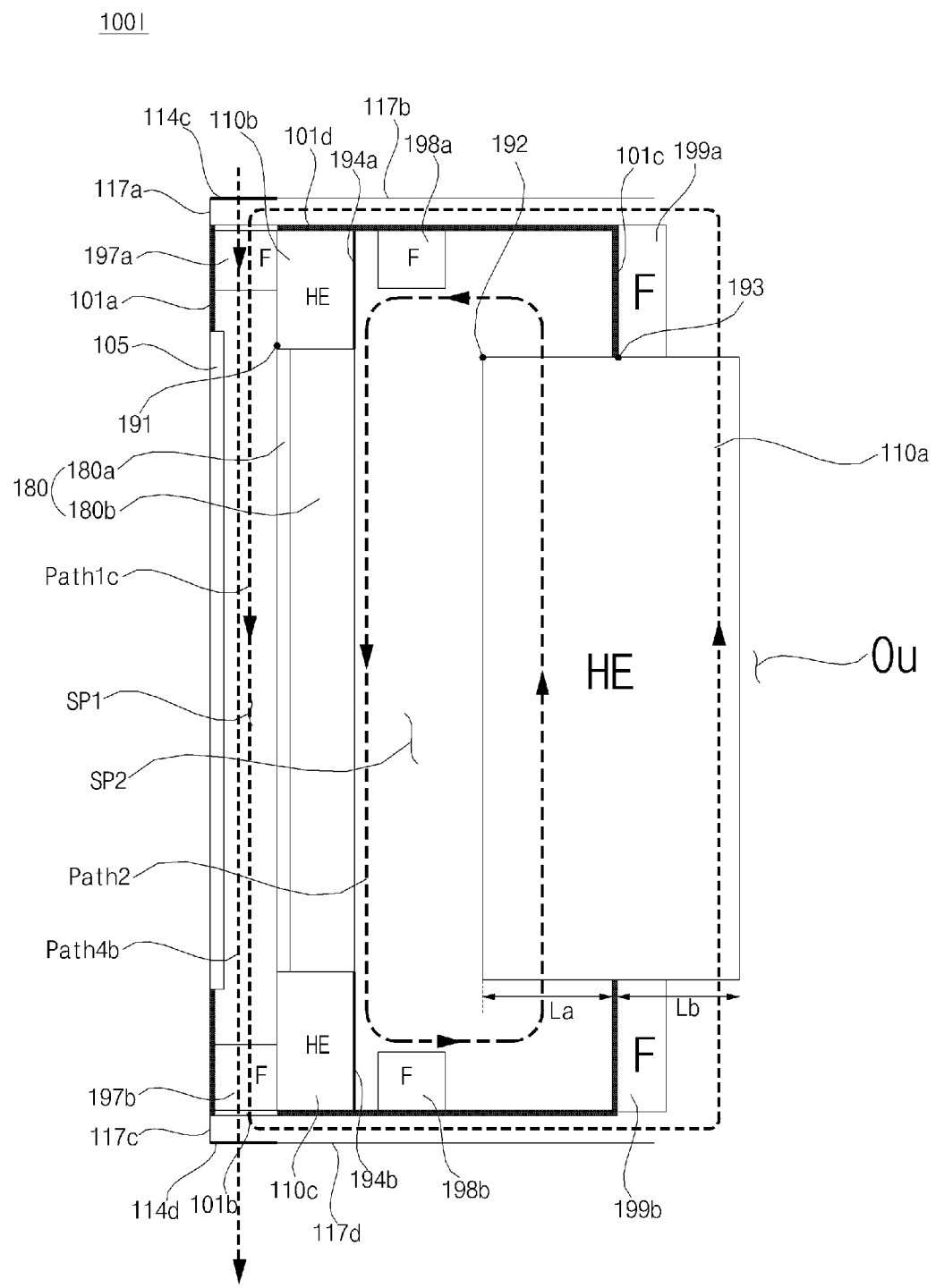

Next, FIG. 14 shows another example of the internal structure of the display apparatus.

The display apparatus 100l of FIG. 14 differs from the display apparatus 100i of FIG. 11 in that the first air flow Path1b is a circulating flow in a rectangular shape rather than a flow in a cap shape.

To this end, the display apparatus 100l of FIG. 14 may further include a guide portion 114 disposed in at least one of the upper portion and the lower part of the first space SP1 to guide the first air flow Path1b from the outside Ou toward the first space SP1.

In FIG. 14, a first guide portion 117a, which is disposed in an upper portion of the first space SP1 and extends from the upper area of the front case 101a, a second guide portion 117b, which intersects the first guide portion 117a and extends in parallel with the first guide portion 117b, a third guide portion 117c, which is disposed in a lower portion of the first space SP1 and extends into the lower area of the front case 101a, and a fourth guide portion 117d, which intersects the third guide portion 117c and extends in parallel with the lower case 101b, are exemplarily shown.

In order to smoothly form the first air flow, the second guide portion 117b preferably extends and protrudes so as to be longer than the upper case 101d.

The fourth guide portion 117d preferably extends and protrudes so as to be longer than the lower case 101b.

Although the second case 102a and the third case 102b are not shown in FIG. 14 in contrast with FIG. 11, the display apparatus 100l may further include the second case 102a.

The display apparatus according to embodiments of the present invention is not limited to configurations and methods of the embodiments described above. Variations may be made to the embodiments described above by selectively combining all or some of the embodiments.

As is apparent from the above description, According to an embodiment of the present invention, a display apparatus includes a case, a display inside the case, a heat exchanger disposed on a rear surface of the case to perform heat exchange between the outside and the inside of the case, wherein a first space and a second space separated from each other are formed on the front surface and rear surface of the display, respectively, and heat exchange is performed between the first space and the second space, wherein heat exchange with the second space and the outside is performed through the heat exchanger. By such multiple heat exchanges, the temperature inside the display apparatus which is installable outside may be effectively lowered. Particularly, the first space on the front surface of the display and the second space on the rear surface of the display are separated to reduce the temperature of the first space through heat exchange with the second space and to reduce the temperature of the second space through heat exchange with the outside by the heat exchanger disposed on the rear surface of the case. Thereby, heat exchange and temperature reduction may be performed stage by stage. Therefore, the temperature inside the display apparatus which is installable outside may be effectively lowered.

The display apparatus may further include at least one of a second heat exchanger disposed at an upper portion of the display to perform heat exchange between the first space and the second space, and a third heat exchanger disposed at a lower portion of the display to perform heat exchange between the first space and the second space. Through the second heat exchanger, the third heat exchanger, and the like, heat exchange between the first space and the second space may be more effectively performed.

The display apparatus may further include a first temperature sensing unit to sense the temperature of the first space, a second temperature sensing unit to sense the temperature of the second space, and a third temperature sensing unit to sense the temperature of the outside. The display apparatus may controls an air flow to be formed in at least one of the first space, the second space, and the outside based on the temperature information from the first temperature sensing unit to the third temperature sensing unit, thereby effectively cooling the inside of the display apparatus.

The display apparatus may further include a first opening and closing part disposed in an upper portion of the first space and selectively opened and closed and a second opening and closing part disposed in a lower portion of the first space and selectively opened and closed. By forming various air flows in accordance with opening and closing of the first opening and closing part and the second opening and closing part, heat exchange in the first space may be efficiently performed.

The display apparatus may further include a first opening disposed in an upper portion of the first space and a second opening disposed in a lower portion of the first space. Accordingly, external air may be introduced into the first space. Thereby, heat exchange of the first space may be efficiently performed.

According to another embodiment of the present invention, a display apparatus includes a case, a display inside the case, and a heat exchanger disposed on a rear surface of the case and to perform heat exchange between the outside and the inside of the case, wherein a first space and a second space separated from each other are formed on the front surface and the rear surface of the display, respectively, and heat exchange is performed between the first space and the outside and between the first space and the second space through a first air flow formed in the first space and on the outside. By such multiple heat exchanges, the temperature inside the display apparatus which is installable outside may be effectively lowered.

The display apparatus may further include a guide portion disposed in at least one of the upper portion and lower portion of the first space to guide the first air flow from the outside toward the first space. Thereby, the air flow from the outside toward the first space may be more smoothly formed.

The display apparatus may further include at least one of a second heat exchanger disposed at an upper portion of the display to perform heat exchange between the first space and the second space and a third heat exchanger disposed at a lower portion of the display to perform heat exchange between the first space and the second space. Through the second heat exchanger, the third heat exchanger, and the like, heat exchange between the first space and the second space may be more effectively performed.

The display apparatus may further include a first temperature sensing unit to sense the temperature of the first space, a second temperature sensing unit to sense the temperature of the second space, and a third temperature sensing unit to sense the temperature of the outside. The display apparatus may control an air flow to be formed in at least one of the first space, the second space, and the outside based on the temperature information from the first temperature sensing unit to the third temperature sensing unit, thereby effectively cooling the inside of the display apparatus.

The display apparatus may further include a first opening disposed in an upper portion of the first space and a second opening disposed in a lower portion of the first space, such that the first air flow may be smoothly formed. Thereby, heat exchange of the first space may be efficiently performed.

According to yet another embodiment of the present invention, a display apparatus includes a case, a display inside the case, and a heat exchanger disposed on a rear surface of the case to perform heat exchange between the outside and the inside of the case, wherein a first space and a second space separated from each other are formed on the front surface and the rear surface of the display, respectively, and heat exchange is performed between the first space, the second space and the outside through a first air flow formed in the first space, a second air flow formed in the second space, and a third air flow formed at the outside. Thereby, the temperature inside the display apparatus which is installable outside may be effectively lowered.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display apparatus comprising:
   a case;
   a display inside the case;
   a heat exchanger disposed on a rear surface of the case to perform heat exchange between an outside and an inside of the case;
   a first temperature sensing unit to sense a first temperature of a first space;
   a second temperature sensing unit to sense a second temperature of a second space;
   a third temperature sensing unit to sense a third temperature of the outside;
   a controller to control an air flow to be formed in at least one of the first space, the second space, or the outside, based on temperature information obtained from the first temperature sensing unit, the second temperature sensing unit, and the third temperature sensing unit;
   a first fan driving unit to drive at least one fan module disposed in the first space;
   a second fan driving unit to drive at least one fan module disposed in the second space; and
   a third fan driving unit to drive at least one fan module disposed at the outside,
   wherein the first space and the second space separated from each other are formed on a front surface and a rear surface of the display, respectively, and heat exchange is performed between the first space and the second space,
   wherein heat exchange with the second space and the outside is performed through the heat exchanger,
   wherein heat exchange is performed between the first space and the second space based on a first air flow in the first space and a second air flow in the second space,
   wherein the first air flow and the second air flow are separated from each other,
   wherein the display includes a panel and a circuit unit to output an electric signal to the panel, and
   wherein when the second temperature is highest and the third temperature is lowest among the first to third temperatures, the controller is configured to:
   not operate the first fan driver and to operate the second fan driver and the third fan driver; or
   operate only the second fan driver.

2. The display apparatus according to claim 1, wherein the heat exchange with the second space and the outside is performed based on a third air flow on the outside and the second air flow in the second space.

3. The display apparatus according to claim 2, wherein:
   the at least one fan module disposed in the first space is configured to form the first air flow; and
   the at least one fan module disposed in the second space is configured to form the second air flow.

4. The display apparatus according to claim 3, wherein the at least one fan module disposed on the outside is configured to form the third air flow.

5. The display apparatus according to claim 1, further comprising:
   a first partition disposed at an upper portion of the display, the first partition separating the first space from the second space; and
   a second partition disposed at a lower portion of the display, the second partition separating the first space from the second space.

6. The display apparatus according to claim 1, further comprising at least one of:
   a second heat exchanger disposed at an upper portion of the display for heat exchange between the first space and the second space; and
   a third heat exchanger disposed at a lower portion of the display for heat exchange between the first space and the second space.

7. The display apparatus according to claim 6, further comprising at least one of:
   a fourth heat exchanger disposed in an upper portion of the first space; and
   a fifth heat exchanger disposed in a lower portion of the first space.

8. The display apparatus according to claim 1, further comprising:
   a first opening and closing part disposed in an upper portion of the first space and selectively opened and closed; and
   a second opening and closing part disposed in a lower portion of the first space and selectively opened and closed,
   wherein the first air flow is formed in the first space when the first opening and closing part and the second opening and closing part are closed, and
   wherein a fourth air flow according to introduction of external air from the outside into the first space when the first opening and closing part and the second opening and closing part are opened.

9. The display apparatus according to claim 1, further comprising:
   a first opening disposed in an upper portion of the first space;
   a second opening disposed in a lower portion of the first space; and
   a filter unit to filter foreign substances to prevent the foreign substances from flowing into the first space through the first opening.

10. The display apparatus according to claim 1, wherein the heat exchanger comprises one of a plate heat exchanger, a heat pipe heat exchanger, and a double-sided heat sink heat exchanger.

11. The display apparatus according to claim 1, wherein:
    the heat exchanger protrudes farther to the second space than to the outside of the case;
    a first length of protrusion of the heat exchanger toward the second space is greater than a second length of protrusion of the heat exchanger toward the outside of the case; and
    a size of the second space is greater than a size of the first space.

* * * * *